US012685121B2

(12) United States Patent
Then et al.

(10) Patent No.: US 12,685,121 B2
(45) Date of Patent: Jul. 14, 2026

(54) GALLIUM NITRIDE (GaN) DEVICES WITH THROUGH-SILICON VIAS

(71) Applicant: Intel Corporation, Santa Clara, CA (US)

(72) Inventors: Han Wui Then, Portland, OR (US); Marko Radosavljevic, Portland, OR (US); Heli Chetanbhai Vora, Hillsboro, OR (US); Samuel James Bader, Hillsboro, OR (US); Ahmad Zubair, Hillsboro, OR (US); Thomas Hoff, Hillsboro, OR (US); Pratik Koirala, Portland, OR (US); Michael S. Beumer, Portland, OR (US); Paul Nordeen, Hillsboro, OR (US); Nityan Nair, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/088,545

(22) Filed: Dec. 24, 2022

(65) Prior Publication Data

US 2024/0213118 A1     Jun. 27, 2024

(51) Int. Cl.
H01L 29/15 (2006.01)
H01L 31/0256 (2006.01)
(Continued)

(52) U.S. Cl.
CPC ............. H10W 20/20 (2026.01); H01P 3/003 (2013.01); H10D 30/475 (2025.01);
(Continued)

(58) Field of Classification Search
CPC ............. H10D 62/8503; H10D 64/111; H10D 30/475; H10W 44/20; H10W 20/4421;
(Continued)

(56) References Cited

U.S. PATENT DOCUMENTS

| | | | |
|---|---|---|---|
| 7,745,848 B1 * | 6/2010 | Rajagopal | H10D 62/8503 438/285 |
| 9,929,107 B1 * | 3/2018 | Birner | H10W 42/121 |

(Continued)

*Primary Examiner* — Niki H Nguyen
(74) *Attorney, Agent, or Firm* — Schwabe, Williamson & Wyatt P.C.

(57) ABSTRACT

Gallium nitride (GaN) devices with through-silicon vias for integrated circuit technology are described. In an example, an integrated circuit structure includes a layer including gallium and nitrogen, the layer including gallium and nitrogen above a silicon substrate. A backside structure is below the silicon substrate and opposite the layer including gallium and nitrogen, the backside structure including conductive features and dielectric structures. The integrated circuit structure also includes a plurality of through-silicon via power bars having a staggered arrangement, individual ones of the through-silicon via power bars extending through the layer including gallium and nitrogen and through the silicon substrate to a corresponding one of the conductive features of the backside structure, and individual ones of the through-silicon via power bars having a tapered portion coupled to an essentially vertical portion.

20 Claims, 16 Drawing Sheets

(51) Int. Cl.

| | |
|---|---|
| *H01P 3/00* | (2006.01) |
| *H10D 30/47* | (2025.01) |
| *H10D 62/85* | (2025.01) |
| *H10D 64/00* | (2025.01) |
| *H10W 20/20* | (2026.01) |
| *H10W 20/41* | (2026.01) |
| *H10W 20/44* | (2026.01) |
| *H10W 44/20* | (2026.01) |

(52) U.S. Cl.
CPC ....... *H10D 62/8503* (2025.01); *H10D 64/111* (2025.01); *H10W 20/427* (2026.01); *H10W 20/4421* (2026.01); *H10W 44/20* (2026.01); *H10W 44/216* (2026.01)

(58) Field of Classification Search
CPC . H10W 20/427; H10W 44/216; H10W 70/63; H10W 20/20; H10W 20/023; H10W 20/069; H10W 70/65; H10W 20/40; H10W 20/49; H10W 20/42; H10W 44/248; H01P 3/003; H10F 19/00; H10F 30/10; H10F 71/00; H10F 77/146; H10P 72/74; H10P 72/7424; H10P 72/7436
See application file for complete search history.

(56) References Cited

U.S. PATENT DOCUMENTS

| | | | | |
|---|---|---|---|---|
| 9,991,373 | B1 * | 6/2018 | Birner | H10D 64/254 |
| 10,132,996 | B2 * | 11/2018 | Lambert | G02B 6/132 |
| 2012/0007255 | A1 * | 1/2012 | Shirota | H10W 20/427 |
| | | | | 257/E23.153 |
| 2014/0264777 | A1 * | 9/2014 | Hobart | H10W 40/254 |
| | | | | 438/584 |
| 2020/0194869 | A1 * | 6/2020 | Arai | H01P 1/047 |
| 2023/0078099 | A1 * | 3/2023 | Ecton | H10W 70/611 |
| | | | | 257/773 |
| 2023/0268431 | A1 * | 8/2023 | Hsueh | H10D 30/475 |
| | | | | 257/183 |

* cited by examiner

150

{111}

152

TOP VIEW

GALLIUM NITRIDE (GaN) DEVICES WITH THROUGH-SILICON VIAS

TECHNICAL FIELD

Embodiments of the disclosure are in the field of advanced integrated circuit structure fabrication and packaging and, in particular, gallium nitride (GaN) integrated circuit technology.

BACKGROUND

Power delivery and RF communication are essential to every compute solution. Si and III-V technologies are facing fundamental limits in power and RF. Future compute solutions will require a better semiconductor technology to continue to deliver better energy efficiencies, better performance, and more functionalities in smaller form factors. Two industry trends are converging to transform power delivery and RF: 300 mm gallium nitride (GaN)-on-Si and monolithic 3D ICs. Amongst semiconductor technologies today, GaN is best for power delivery and RF due to its wide bandgap qualities.

DESCRIPTION OF THE EMBODIMENTS

Figure 1A:
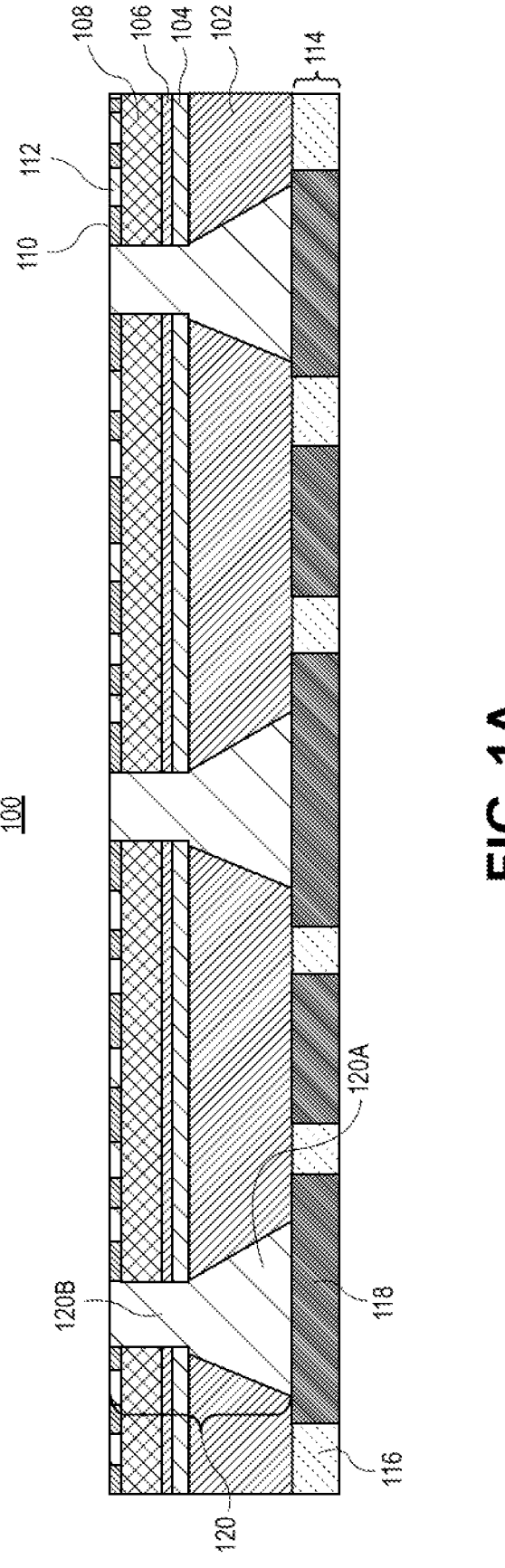
FIG. 1A illustrates a cross-sectional view of an integrated circuit structure including GaN-based devices and through-silicon vias, in accordance with an embodiment of the present disclosure.

Gallium nitride (GaN) devices with through-silicon vias for integrated circuit technology is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with one or more embodiments of the present disclosure, low resistance power through-silicon vias (TSVs) for GaN power delivery are described. One or more embodiments are directed to TSV innovations for Power Delivery and RF.

To provide context, it is an industry challenge to improve the power density of power electronics solutions without compromising on power efficiency. Therefore, industry is looking to deploy GaN transistors that are uniquely capable of higher voltage, high current density and high efficiency to deliver power to CPUs and GPUs. Looking ahead, as industry searches for solutions that are ever smaller than the previous generation, technologies that enable 3D stacking of ICs become indispensable. One key technology is TSV (through-Silicon vias). In accordance with embodiments disclosed herein, methods and structures are described to enable reduction of the resistance of TSVs, which will allow designers to achieve lower power dissipation, hence higher efficiency and better performance.

Previous approaches involved the use of relatively shorter TSVs. However, shorter TSVs require the silicon substrate to be thinned (by grinding) further. This places stringent requirements on grinding uniformity, and wafer integrity, requiring significant investments in tool development and process tolerance.

In accordance with one or more embodiments of the present disclosure, the profile and aspect ratio of TSVs is engineered using the crystal properties of the silicon substrate. In one embodiment, a TSV structure has a tapering profile to improve (reduce) the via resistance. Embodiments can be implemented to enable the building of and offer differentiating products with efficiency and dense power delivery.

As an exemplary structure, FIG. 1A illustrates a cross-sectional view of an integrated circuit structure including GaN-based devices and through-silicon vias, in accordance with an embodiment of the present disclosure.

Referring to FIG. 1A, an integrated circuit structure 100 includes a silicon substrate 102, such as an Si(100) substrate. A dielectric layer 104, such as a silicon oxide buried oxide layer, is on the silicon substrate 102. A GaN device layer 108 is above the dielectric layer 104. The GaN device layer 108 can represent GaN transistor FEOL layers, and may further include co-integrated CMOS structures. A seed layer 106, such as a Si(111) seed layer, can be included between the GaN device layer 108 and the dielectric layer 104, as is depicted. A BEOL layer can be on the GaN device layer 108, and can include conductive features 110 separated by dielectric structures 112. A backside structure 114 is below the silicon substrate 102. The backside structure 114 can include bottom metal features 118 and intervening dielectric structures 116.

Referring again to FIG. 1A, in accordance with one or more embodiments of the present disclosure, through-silicon vias (TSVs) 120 are included in the integrated circuit structure 100. In an embodiment, each TSV 120 extends from a conductive feature 110 of the BEOL layer(s) to a bottom metal feature 118 of the backside structure 114, as is depicted. In an embodiment, each TSV 120 includes a tapered portion 120A coupled to a vertical or essentially vertical portion 120B, as is depicted. In one embodiment, the vertical or essentially vertical portion 120B is in the layers above the silicon substrate 102, and the tapered portion 120A is in the silicon substrate 102, as is depicted. In one such embodiment, the tapered portion is defined by Si(111) crystal planes, e.g., as exposed during a wet etch process. In an embodiment, each TSV includes a dielectric liner and a copper fill.

Figures 1B, 1C:
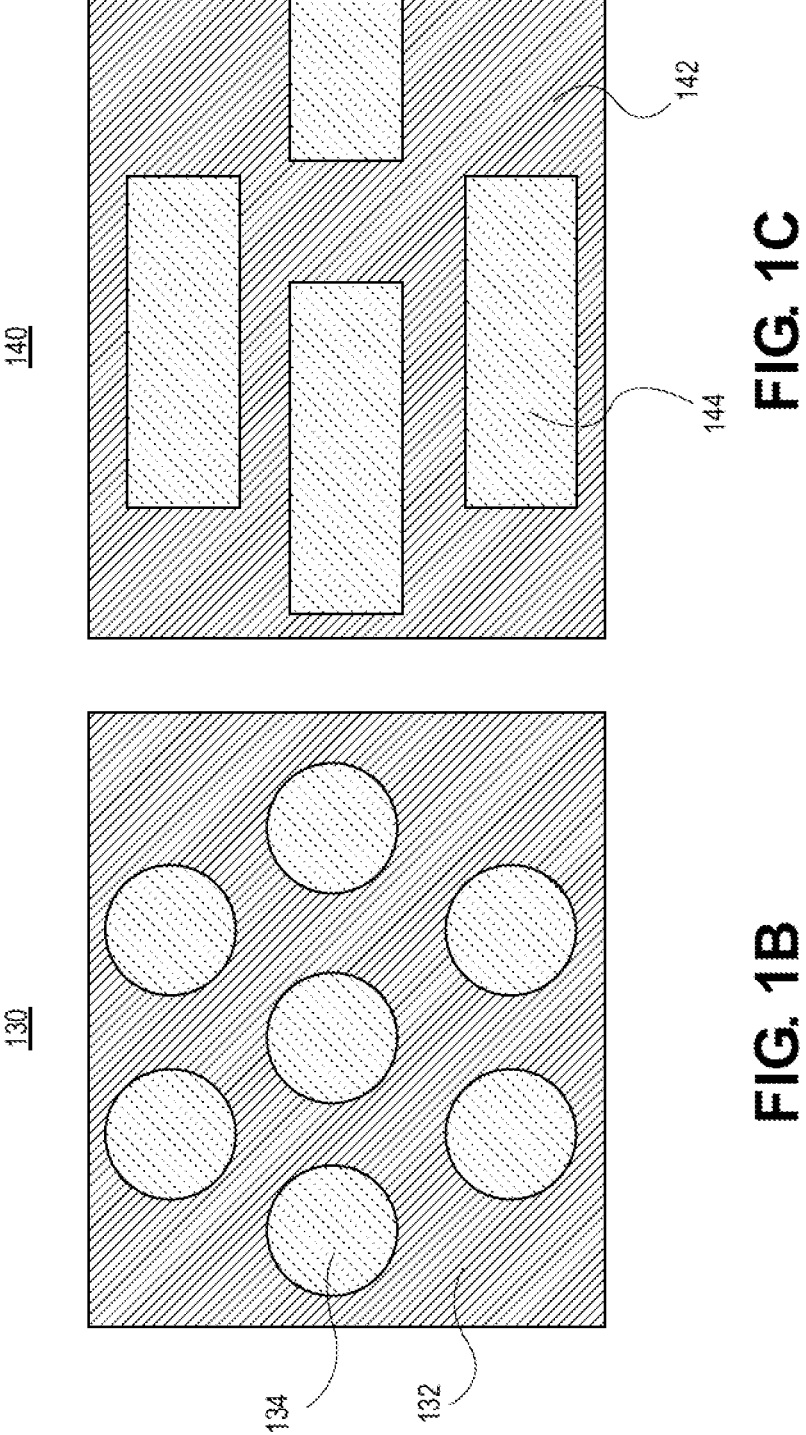
FIG. 1B illustrates a plan view of conventional TSVs for power delivery.
FIGS. 1C and 1D illustrate a plan view and corresponding angled cross-sectional view, respectively, of TSVs for power delivery, in accordance with an embodiment of the present disclosure.
Figure 1D:
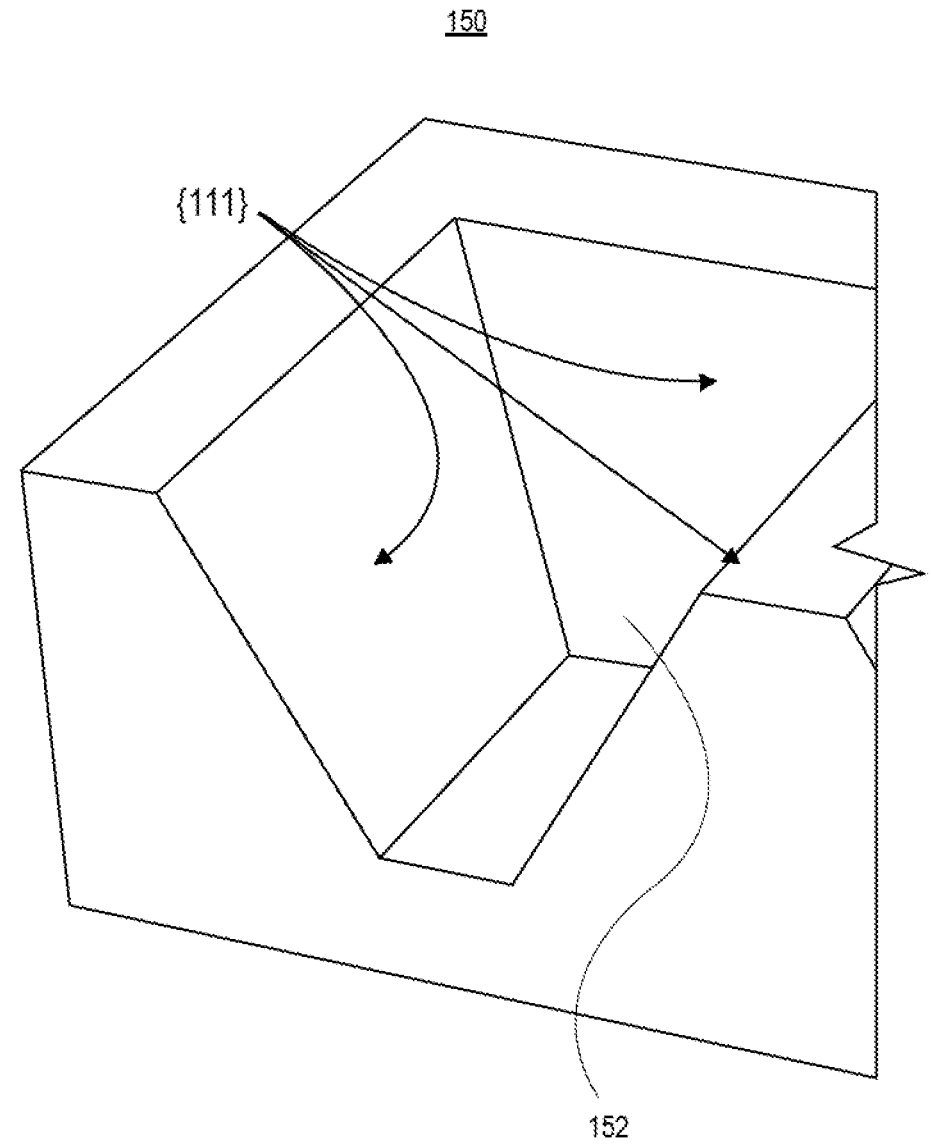

In one aspect, TSVs such as described herein can be power bar structures. As a comparative example, FIG. 1B illustrates a plan view of conventional TSVs for power delivery. FIGS. 1C and 1D illustrate a plan view and corresponding angled cross-sectional view, respectively, of TSVs for power delivery, in accordance with an embodiment of the present disclosure.

Referring to FIG. 1C, a conventional power structure 130 includes cylindrical TSVs 134 in a silicon substrate 132.

By contrast, referring to FIG. 1C, a power structure 140 includes tapered TSVs 144 in a silicon substrate 142 and that can have extended geometries to provide staggered TSV power bars, as is depicted. Referring to FIG. 1D, a power structure 150 includes a TSV power bar structure 152. The TSV power bar structure 152 is depicted as defined by Si(111) surfaces.

With reference again to FIGS. 1A, 1C and 1D, in accordance with an embodiment of the present disclosure, an integrated circuit structure 100 includes a layer including gallium and nitrogen 108, the layer including gallium and nitrogen 108 above a silicon substrate 102. A backside structure 114 is below the silicon substrate 102 and opposite the layer including gallium and nitrogen 108, the backside structure 114 including conductive features 118 and dielectric structures 116. The integrated circuit structure 100 also includes a plurality of through-silicon via power bars 120/144 having a staggered arrangement, individual ones of the through-silicon via power bars 120/144 extending through the layer including gallium and nitrogen 108 and through the silicon substrate 120 to a corresponding one of the conductive features 118 of the backside structure 114, and individual ones of the through-silicon via power bars 120/144 having a tapered portion 120A coupled to an essentially vertical portion 120B.

In an embodiment, the essentially vertical portion 120B is in the layer including gallium and nitrogen 108, and the tapered portion 120A is in the silicon substrate 102. In an embodiment, the tapered portion 120A is defined by Si(111) crystal planes. In an embodiment, individual ones of the through-silicon via power bars 120/144 include a dielectric liner and a copper fill. In an embodiment, the integrated circuit structure 100 further includes a layer including conductive features 110 above the layer including gallium and nitrogen 108, where individual ones of the through-silicon via power bars 120/144 extend to a corresponding one of the conductive features 110 of the layer.

Figures 1E, 1F:
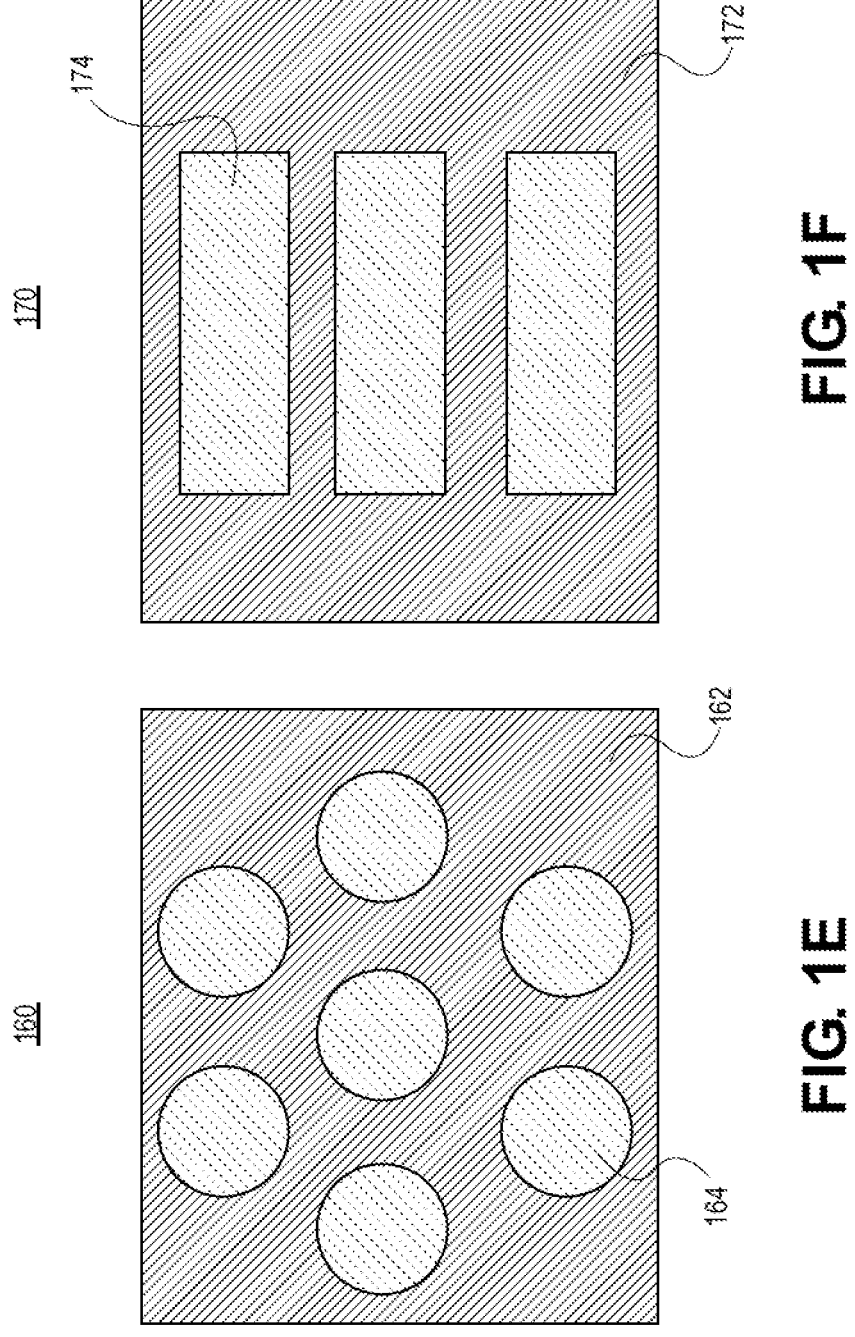
FIG. 1E illustrates a plan view of conventional TSVs for waveguide applications.
FIG. 1F illustrates a plan view of TSVs for waveguide applications, in accordance with an embodiment of the present disclosure.

In another aspect, TSVs such as described herein can be used to fabricate waveguide structures. As a comparative example, FIG. 1E illustrates a plan view of conventional TSVs for waveguide applications. FIG. 1F illustrates a plan view of TSVs for waveguide applications, in accordance with an embodiment of the present disclosure.

Referring to FIG. 1E, a conventional coaxial waveguide structure 160 includes cylindrical TSVs 164 in a silicon substrate 162. The outer TSVs are ground TSVs, and the central TSV is a signal TSV.

By contrast, referring to FIG. 1F, a co-planar waveguide structure 170 includes tapered TSVs 174 in a silicon substrate 172 and that can have extended geometries to provide co-planar waveguide structures, as is depicted. In one embodiment, the outer TSVs are ground TSVs, and the inner TSV is a signal TSV.

With reference again to FIGS. 1A and 1F, in accordance with an embodiment of the present disclosure, an integrated circuit structure 100 includes a layer including gallium and nitrogen 108, the layer including gallium and nitrogen 108 above a silicon substrate 102. A backside structure 114 is below the silicon substrate 102 and opposite the layer including gallium and nitrogen 108, the backside structure 114 including conductive features 118 and dielectric structures 116. The integrated circuit structure 100 also includes a waveguide structure including a plurality of through-silicon vias 120/174 having a co-planar arrangement, individual ones of the through-silicon vias 120/174 extending through the layer including gallium and nitrogen 108 and through the silicon substrate 102 to a corresponding one of the conductive features 118 of the backside structure 114, and individual ones of the through-silicon vias 120/174 having a tapered portion 120A coupled to an essentially vertical portion 120B.

In an embodiment, the essentially vertical portion 120B is in the layer including gallium and nitrogen 108, and the tapered portion 120A is in the silicon substrate 102. In an embodiment, the tapered portion 120A is defined by Si(111) crystal planes. In an embodiment, individual ones of the through-silicon vias include a dielectric liner and a copper fill. In an embodiment, the integrated circuit structure 100 further includes a layer including conductive features 110 above the layer including gallium and nitrogen 108, wherein individual ones of the through-silicon vias 120/174 extend to a corresponding one of the conductive features 110 of the layer.

In accordance with one or more embodiments of the present disclosure, a process flow for fabricating the above described TSVs can include first fabricating GaN transistors (and, possibly, heterogeneously integrated Si CMOS and ICs) on the front side of a wafer. Conventional TSVs with a straight profile from the GaN transistors to buried oxide layer are then fabricated. The front side of the wafer is protected, and the wafer is flipped and bonded to a carrier wafer. From the backside of the wafer, the silicon substrate can be thinned to a thickness of about 100 microns. The tapered portions of the TSV structure is then fabricated by using a wet etch process to form crystallographic planes on {111} surfaces of the Si(100) substrate, effectively shaping the originally formed TSV portion in the silicon substrate. The openings are than filled with a conductive material (e.g., copper) which be performed after first forming a dielectric liner within the openings. Backside interconnects can then be fabricated on the backside of the wafer.

To provide further context, RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and 5G standards. RF PAs typically operate at several dB back-off from its saturated mode in order to meet the linearity requirements. Thus, the efficiency suffers and in most PAs, it may degrade by a factor of 2-3×.

Due to its wide bandgap and high critical breakdown electric field, gallium nitride (GaN) transistors are considered for high voltage applications such as power converters, RF power amplifiers, RF switch and high voltage applications. Simple transistor architecture, namely, having a single gate, source and drain, falls short of realizing the full potential of GaN in achieving the maximum breakdown voltage as dictated by its material properties. This is because the drain electric field concentrates at the edge of the gate and causes premature breakdown.

It is to be appreciated that the above general structure including a GaN device layer above a silicon substrate, with tapered TSVs there through, can be a suitable foundation for a variety of GaN based devices. Described below are GaN based devices that may be included, e.g., in the GaN device layer described in association with FIG. 1A.

Embodiments of the present disclosure relate to gallium nitride (GaN) transistors having source field plates. In embodiments, the transistors of the present disclosure have a gallium nitride (GaN) layer disposed above a substrate. A gate structure is disposed above the GaN layer. A source region and a drain region are disposed on opposite sides of the gate structure. The source field plate may be biased to an electrical potential which is the same as the source. The transistors of the present disclosure may enable new circuit architectures, such as a cross-coupled pairs. Additionally, the distance the source field plate extends above the drain can be independently adjusted to improve the effect the source field plate has on the field distribution, and hence increase breakdown voltage and linearity. In an embodiment, the transistor is operated in an enhancement mode. In an embodiment the gate structure may have a "T" shape in order to reduce the electrical resistance of the gate structure. In an embodiment, the transistor may include a second gate structure or multiple gate structures disposed between the gate structure and the source field plate to provide a multi-gate switch for, for example, an RF voltage divider.

Figure 2:
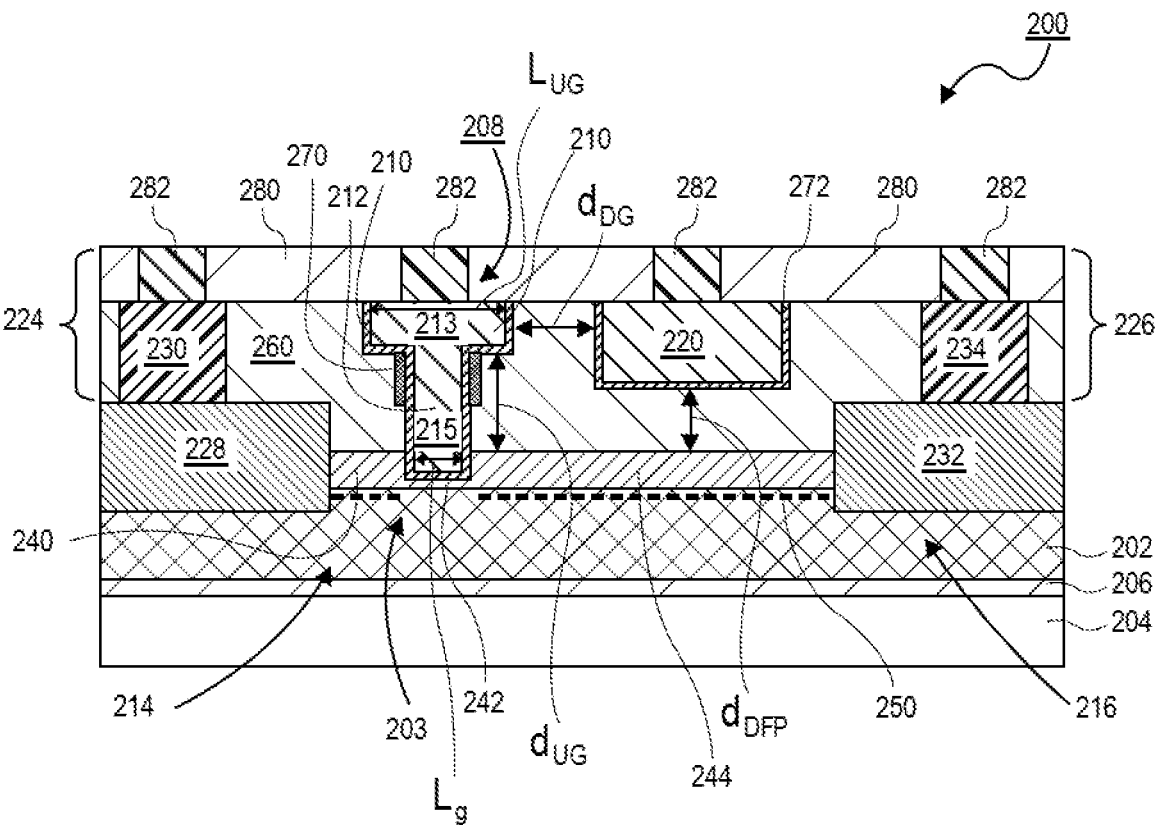
FIG. 2 illustrates a cross-sectional view of a transistor having a source field plate, in accordance with embodiments of the present disclosure.

FIG. 2 illustrates as transistor 200 having a source field plate in accordance with embodiments of the present disclosure. Transistor 200 includes a GaN layer 202 disposed above a substrate 204. A buffer layer 206 may be disposed between GaN layer 202 and substrate 204. A gate structure 208 is disposed above GaN layer 202 as illustrated in FIG. 2. Gate structure 208 may include a gate dielectric 210, such as a high-k gate dielectric, such as but not limited to hafnium oxide (e.g., $HfO_2$) and aluminum oxide (e.g., $Al_2O_3$), and a gate electrode 212, such as a metal gate electrode. A source region 214 and a drain region 216 are disposed on opposite sides of gate structure 208 as illustrated in FIG. 2.

Transistor 200 includes a source field plate 220 located above drain region 216. Source field plate 220 is separated from drain region 216 by a distance ($d_{DFP}$) as illustrated in FIG. 2. Source field plate 220 may be separated from gate structure 208 by a distance $d_{DG}$.

In an embodiment, source region 214 includes a source contact 224 and drain region 216 includes a drain contact 226. Source contact 224 may include a source semiconductor contact 228 and a source metal contact 230, and drain contact 226 may include a drain semiconductor contact 232 and a drain metal contact 234. In an embodiment as illustrated in FIG. 2, source semiconductor contact 228 and drain semiconductor contact 232 are formed from a group III-N semiconductor, such as but not limited to indium gallium nitride (InGaN). In an embodiment, the group III-N semiconductor has an N+ conductivity, such as, for example, containing Si dopant density greater than $1 \times 10^{18}$ atoms/cm$^3$. In an embodiment, the source metal contact 230 and the drain metal contact 234 include a metal, such as but not limited to titanium. In an embodiment, source field plate 220 is located laterally between drain metal contact 234 and gate structure 208 as shown in FIG. 2.

Transistor 200 may include a polarization layer 240 disposed on GaN layer 202. Polarization layer 240 may be formed from a group III-N semiconductor, such as but not limited to aluminum gallium nitride (AlGaN), aluminum indium nitride (AlInN), aluminum indium gallium nitride (AlInGaN) and indium gallium nitride (InGaN). In an embodiment, polarization layer 240 is sufficiently thick in order to create a two-dimensional electron gas (2DEG) effect or layer 250 in the top surface of GaN layer 202 as illustrated in FIG. 2. In an embodiment, polarization layer 240 has a portion 242 beneath gate structure 208 which is thinner than portion 244 above source region 214 and drain region 216 so that a 2DEG layer or effect is not created in gallium nitride layer 202 beneath gate structure 208 as shown in FIG. 2. In an embodiment, polarization layer 240 is completely removed from under gate structure 208 and gate structure 208 is disposed directly on GaN layer 202. In an embodiment polarization layer 240 is multilayer film including a lower AlN film and an upper AlInN for example. In an embodiment, transistor 200 is operated in an enhancement mode.

Source field plate 220 and gate structure 208 are disposed within dielectric layer 260 as illustrated in FIG. 2. In an embodiment, the top surface of source field plate 220, is coplanar with the top surface of gate structure 208 as illustrated in FIG. 2. In an embodiment, the top surface of dielectric layer 260 is coplanar with the top surface of gate structure 208, and source field plate 220 as illustrated in FIG. 2. In an embodiment, the top surface of source metal contact 230 and the top surface of drain metal contact 234 are coplanar with the top surface of gate structure 208 and the top surface of source field plate 220.

Transistor 200 has a gate length ($L_g$) in a first direction extending between the source region 214 and the drain region 216 as shown in FIG. 2. A channel region 203 is located in GaN layer 202 beneath gate structure 208 and between source region 214 and drain region 216. Transistor 200 has a gate width (Gw) in a direction perpendicular (in and out of the page) to the gate length ($L_g$) direction. In an embodiment, transistor 200 has a gate width (Gw) between 0.010 microns-100 microns. In an embodiment, source field plate 220 extends the entire gate width (Gw) of transistor 200. In an embodiment, gate structure 208 has a "T" shape as illustrated in FIG. 2. Gate structure 208 may include an upper gate portion 213 and a lower gate portion 215. Upper gate portion 213 is distal from GaN layer 202 while lower gate portion 215 is nearer GaN layer 202. In an embodiment, lower gate portion 215 has a length ($L_g$) in the gate length direction which defines the gate length ($L_g$) of transistor 200. In an embodiment, upper gate portion 213 has length ($L_{ug}$) in the gate length direction which is at least two times, and in other embodiments at least three times, greater than the gate length ($L_g$) of lower gate portion 215. In an embodiment, as shown in FIG. 2 upper gate portion 213 extends a distance ($d_{UG}$) above drain region 216 which is greater than the distance $d_{DFP}$ that source field plate 220 extends above drain region 216. A recessed source field plate may provide improved control of the source field. In an embodiment, a recessed source field plate may exert a depletion effect on the 2DEG in the extended drain region. In an embodiment, upper gate portion 213 extends a distance ($d_{UG}$) above drain region 216 which is the same distance $d_{DFP}$ that source field plate 220 extends above drain region 216. In an embodiment, gate dielectric 210 is disposed along the sidewalls and bottom of upper gate portion 213 and along the sidewalls and bottom of lower gate portion 215 as illustrated in FIG. 2.

In an embodiment, source field plate 220 may be biased separately from a gate voltage (Vg) applied to gate structure 208. In an embodiment, source field plate 220 may be biased to a potential different than Vss or ground. In an embodiment, source field plate 220 may be biased differently than the voltage applied to source region 214. In an embodiment, source field plate 220 may be biased differently than a voltage applied to drain region 216. In an embodiment, source field plate 220 is not electrically connected to drain region 216.

In an embodiment, a pair of insulative spacers 270 are disposed along opposite sides of gate structure 208 as illustrated in FIG. 2. In an embodiment, insulative spacers 270 do not extend the entire height of gate structure 208. In an embodiment, insulative spacers 270 do not contact polarization layer 240 or GaN layer 202. In an embodiment, spacers 270 are formed beneath upper gate portion 213 and on sidewalls of lower gate portion 215 as illustrated in FIG. 2. In an embodiment, insulative spacers 270 are formed from an insulative material, such as but not limited to, silicon nitride and silicon oxynitride, which is different from the dielectric material of dielectric layer 260.

In an embodiment, a second dielectric layer 280 is disposed over dielectric layer 260. A plurality of conductive vias 282 may be disposed in dielectric 280 to enable independent electrical connections to and control of source region 214, drain region 216, source field plate 220 and gate structure 208.

In an embodiment, a high-k dielectric 272, such as but not limited to hafnium oxide (e.g., $HfO_2$) and aluminum oxide (e.g., $Al_2O_3$) may be disposed and on the sidewalls and bottom surface of source field plate 220 as illustrated in FIG. 2. In an embodiment, high-k dielectric 272 is the same high-k dielectric material as gate dielectric layer 210 of gate structure 208. In another embodiment, a high-k dielectric 272 is not included.

Figure 3:
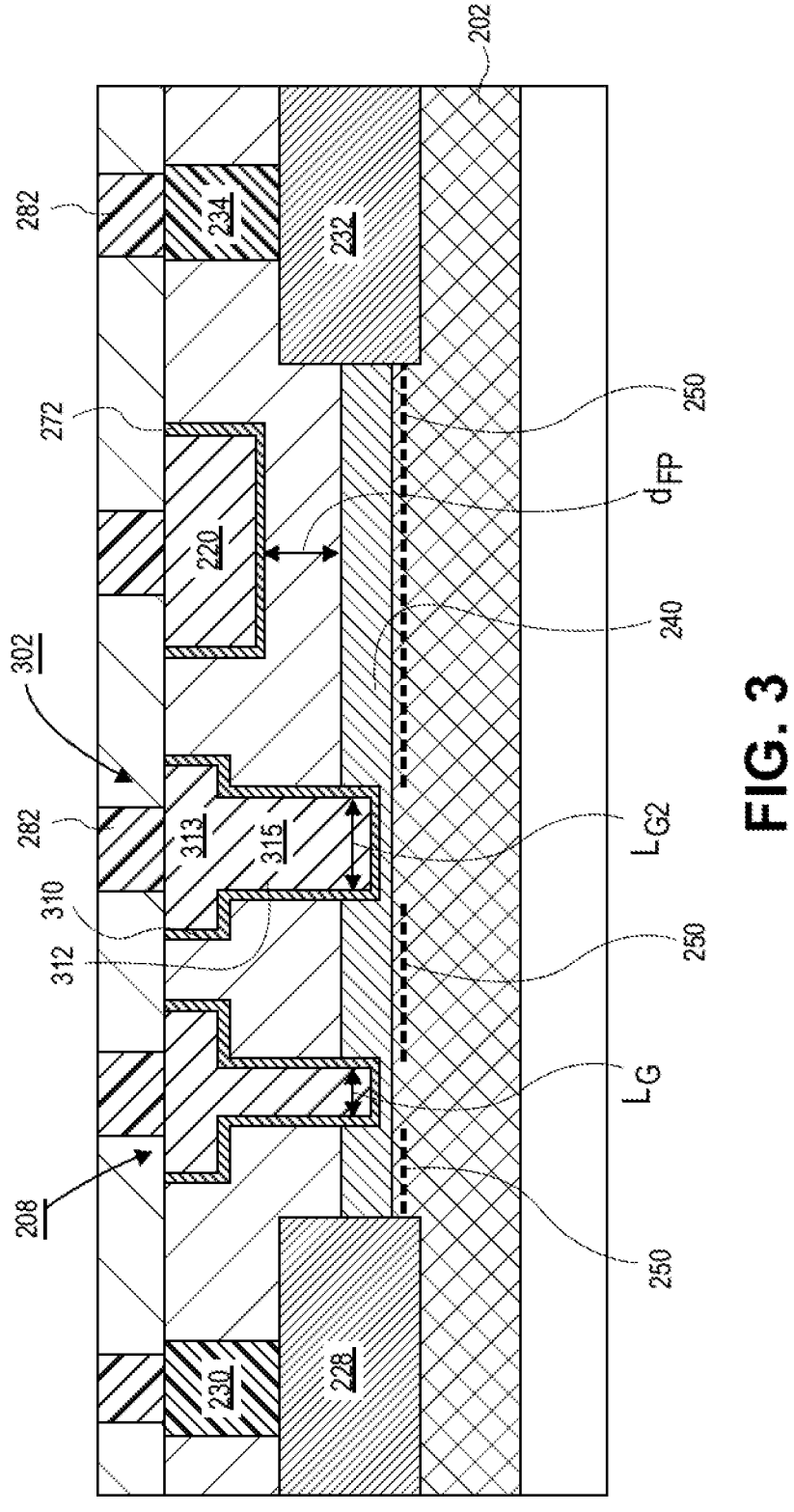
FIG. 3 illustrates a cross-sectional view of a GaN transistor having a source field plate and having multiple gates, in accordance with embodiments of the present disclosure.

FIG. 3 illustrates a GaN transistor 300 having a source field plate and multiple gates. Transistor 300 includes a second gate structure 302 above GaN layer 202 and between gate structure 208 and source field plate 220 as illustrated in FIG. 3. Second gate structure 302 may be recessed into polarization layer 240 so that a 2DEG layer of effect is not formed under second gate structure 302 as illustrated in FIG. 3. Gate structure 302 may include a gate dielectric 310, such as a high-k gate dielectric and a gate electrode 312 as described with respect to gate structure 208. In an embodiment, the second gate structure 302 has a larger gate length ($L_{G2}$) than the gate length ($L_g$) of gate structure 208. That is, in an embodiment, $L_{G2}$ is greater than $L_g$. In an embodiment, $L_{G2}$ is equal to $L_g$. In an embodiment, second gate structure 302 may have a "T" shape including an upper gate portion 313 and a lower gate portion 315 as illustrated in FIG. 3.

In an embodiment, two or more additional gate structures 302 may be disposed over GaN layer 202 and between gate structure 208 and source field plate 220. In an embodiment, gate structure 208 and each of the additional gate structures 302 may be biased independently. In an embodiment, the multiple gates act as an RF voltage divider allowing each gate to be biased with a lower DC voltage. A single gate NMOS transistor may require a large negative gate voltage (Vg) to keep the transistor in an "OFF" state. In an embodiment, transistor 300 may be used in a cascoded power amplifier circuit. Transistor 300 may improve gain by reducing source resistance of the second gate. Having two gate electrodes may protect the corresponding gate oxides from increased voltages.

To provide further context, GaN high voltage transistors in the market are not scaled. GaN transistors in the market today utilize long channel gates and thick p-GaN gate stack that may not be suitable for scaling the transistor to smaller dimensions to improve performance and low resistances. Moreover, coarse lithography techniques that are used may be limited as the industry remains working in 4 inch manufacturing lines that do not have access to the latest lithographic tools and techniques.

In accordance with one or more embodiments of the present disclosure, a heterostructure employing, p-InGaN and p-AlGaN layers in the gate of the GaN transistor, in addition to p-GaN, to enable scaling of the gate stack, thus enabling the further scaling of transistor channel length to improve performance: lower on-resistance and higher drive current. Other enabling features such as p-(III-N) field plate, multi-gate structures and hybrid trench plus implant isolation techniques are also disclosed herein to enable scaling of high voltage GaN transistor solutions. Such features can enable the ultimate scaling of high voltage GaN transistors to provide the highest performance in the smallest possible footprint.

In accordance with an embodiment of the present disclosure, a high voltage GaN transistor technology enables power delivery solutions that are more efficient than what is possible today. Servers and graphics products are powered by power delivery solutions with input voltages ranging between 48V to 72V. Discrete GaN transistors are used to step this high input voltage down to 12V on the board so that a second stage voltage conversion can be used in the subsequent power stages to convert the voltage to a desired supply voltage to integrated circuits, ranging from 3.3V to 0.5V, for example. Many stages of conversion are required using Si technology because at each stage, a different Si transistor technology is used. Dissimilar discrete technologies must thus be made to work together on the board or in bulky thick packages. GaN technology is unique in that it is the only technology that can be used across the entire power delivery value chain from 72V down to 0.6V. With a high voltage GaN transistor technology, power can ultimately be delivered at, for example, 72V-48V to the board, and stepped down to 3.3V-12V to the socket of a microprocessor. With higher voltages at the board and socket, many benefits can be realized: the current level (I) on the board can be reduced, power dissipation (proportional to $I^2$) on the board can be significantly reduced, form factor can be significantly reduced (at least 2× shrink, up to 10× or more). At the same form factor, one can then deliver significantly higher power (at least 2× or more) to deliver even higher performance compute solutions.

Figure 4:
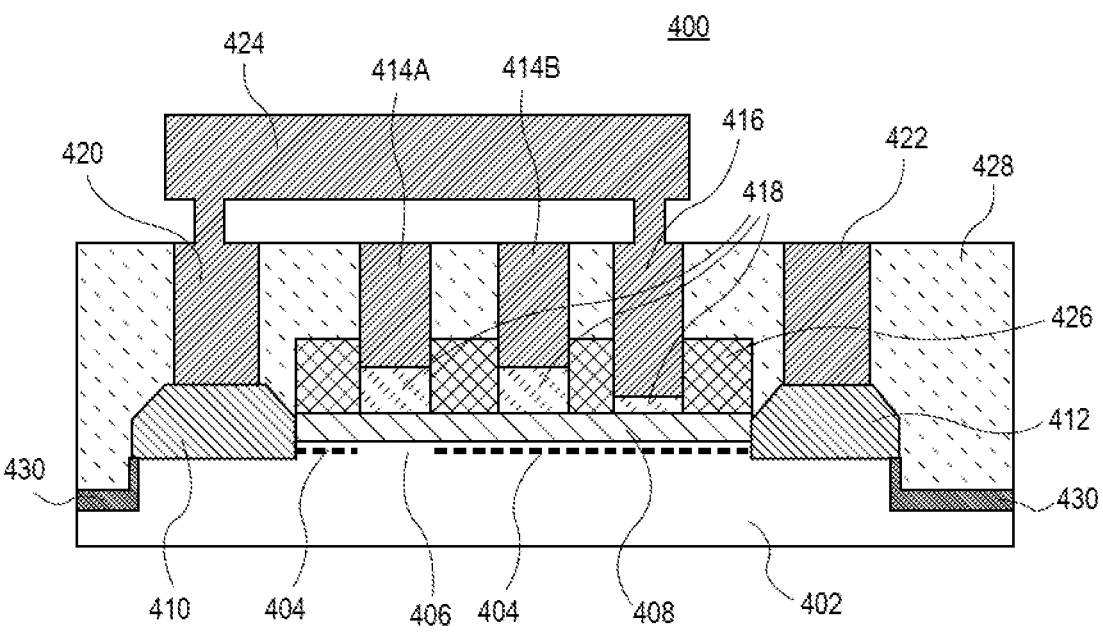
FIG. 4 illustrates a cross-sectional view of a high voltage scaled GaN device with multi-gate technology, in accordance with an embodiment of the present disclosure.

FIG. 4 illustrates a cross-sectional view of a high voltage scaled GaN device with multi-gate technology, in accordance with an embodiment of the present disclosure. Such a device can be fabricated to include a source field plate such as described above, or can be integrated with a device including a source field plate such as described above.

Referring to FIG. 4, a high voltage scaled GaN device 400 includes a GaN layer 402 including 2DEG regions 404 and non 2DEG regions 406. A p-GaN/p-InGaN/p-AlGaN field plating layer 408 is on the GaN layer 402 to provide a field-redistributing effect. N+ InGaN source or drain regions 410 and 412 are on the GaN layer 402. A p-GaN, p-InGaN, p-AlGaN regrown layer 418 is on the field plating layer 408. Gate electrodes 414A and 414B and a source field plate electrode 416 are on the p-GaN, p-InGaN, p-AlGaN regrown layer 418. Source or drain contacts 420 and 422 are on the N+ InGaN source or drain regions 410 and 412. An interconnect line 424 couples the source or drain contact 420 and field plate electrode 416. An insulator layer 426, such as a silicon nitride (SiN) layer is included over the field plating layer 408. An inter-layer dielectric (ILD) layer 428 is over the structure. An H2-implant shallow-trench isolation layer 430 is on either side of the N+ InGaN source or drain regions 410 and 412.

Figure 5:
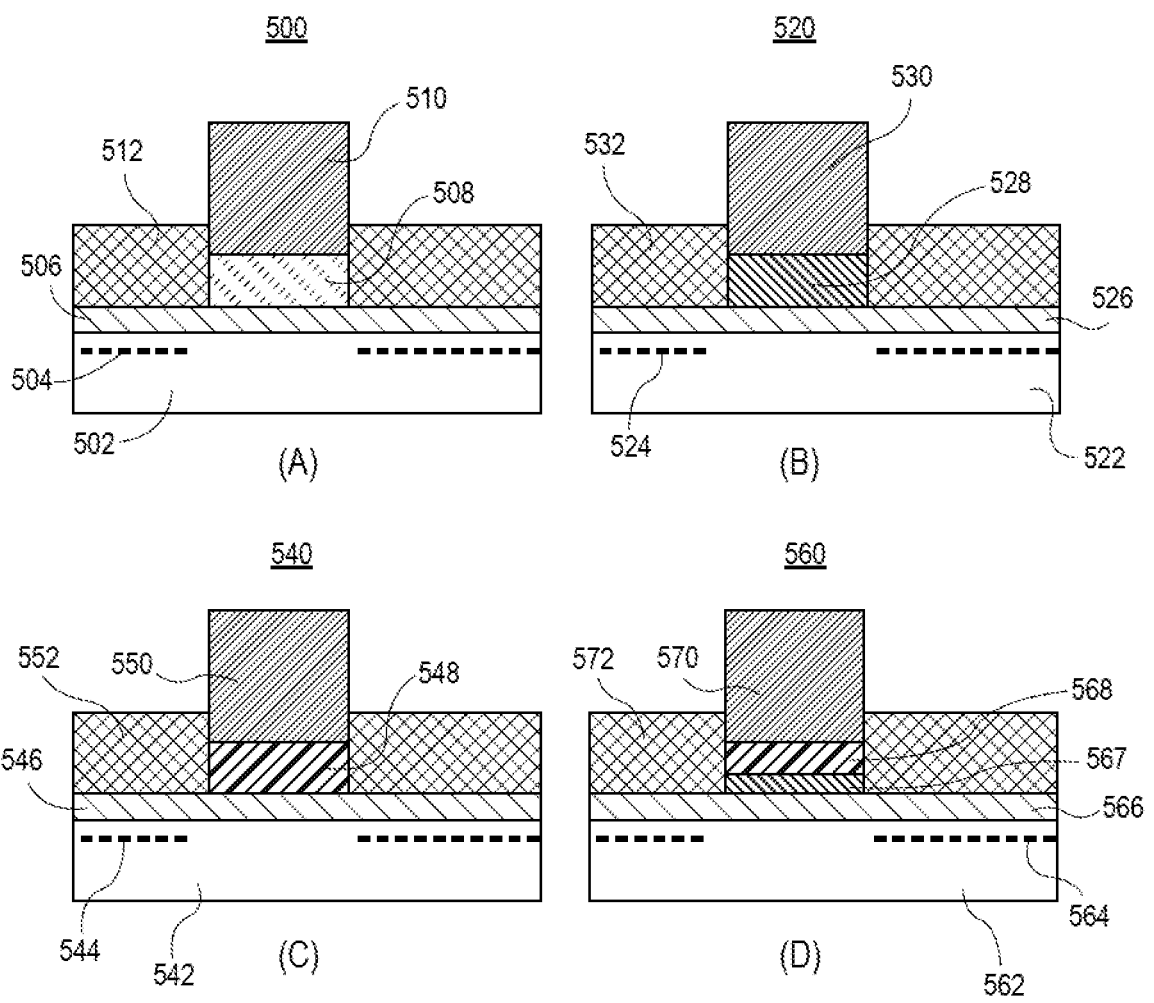
FIG. 5 illustrates cross-sectional views of various structural options for a high voltage scaled GaN device with multi-gate technology, in accordance with an embodiment of the present disclosure.

FIG. 5 illustrates cross-sectional views of various structural options for a high voltage scaled GaN device with multi-gate technology, in accordance with an embodiment of the present disclosure. Such a device can be fabricated to include a source field plate such as described above, or can be integrated with a device including a source field plate such as described above.

Referring to part (A) of FIG. 5, a gate structure 500 for a high voltage scaled GaN device includes a GaN layer 502 having a 2DEG layer 504. An AlGaN layer 506 is on the GaN layer 502. A p-GaN layer 508 is on the AlGaN layer 506. A gate electrode 510 is on the p-GaN layer 508. The gate electrode 510 and the p-GaN layer 508 are within a dielectric layer 512, such as a silicon nitride (SiN) layer.

Referring to part (B) of FIG. 5, a gate structure 520 for a high voltage scaled GaN device includes a GaN layer 522 having a 2DEG layer 524. An AlGaN layer 526 is on the GaN layer 522. A p-AlGaN layer 528 is on the AlGaN layer 526. A gate electrode 530 is on the p-AlGaN layer 528. The gate electrode 530 and the p-AlGaN layer 528 are within a dielectric layer 532, such as a silicon nitride (SiN) layer.

Referring to part (C) of FIG. 5, a gate structure 540 for a high voltage scaled GaN device includes a GaN layer 542 having a 2DEG layer 544. An AlGaN layer 546 is on the GaN layer 542. A p-InGaN layer 548 is on the AlGaN layer 546. A gate electrode 550 is on the p-InGaN layer 548. The gate electrode 550 and the p-InGaN layer 548 are within a dielectric layer 552, such as a silicon nitride (SiN) layer.

Referring to part (D) of FIG. 5, a gate structure 560 for a high voltage scaled GaN device includes a GaN layer 562 having a 2DEG layer 564. An AlGaN layer 566 is on the GaN layer 562. A p-AlGaN layer 567 is on the AlGaN layer 566. A p-InGaN layer 568 is on the p-AlGaN layer 567. A gate electrode 570 is on the p-InGaN layer 568. The gate electrode 570, the p-InGaN layer 568 and the p-AlGaN are within a dielectric layer 572, such as a silicon nitride (SiN) layer.

In an embodiment, using a p-InGaN layer can translate to higher active p-dopants being achieved. With higher active p-dopants compared to p-GaN, thinner p-InGaN can be used to deplete 2DEG in channel for e-mode. Thinner EOT enables shorter channel length, hence higher performance (lower $R_{ON}$ and higher drive current). In an embodiment, using a p-AlGaN layer can translate to higher barrier to electrons, although lower p-dopants. With higher energy barrier to electrons, p-AlGaN can be used to reduce the thickness of the p-doped barrier to enable shorter channel length as well as to increase the P-N junction turn-on voltage and reduce gate leakage. Heterostructures, e.g. p-InGaN/p-AlGaN/AlGaN/GaN channel can be used to achieve combinations of the characteristics described above.

Figure 6:
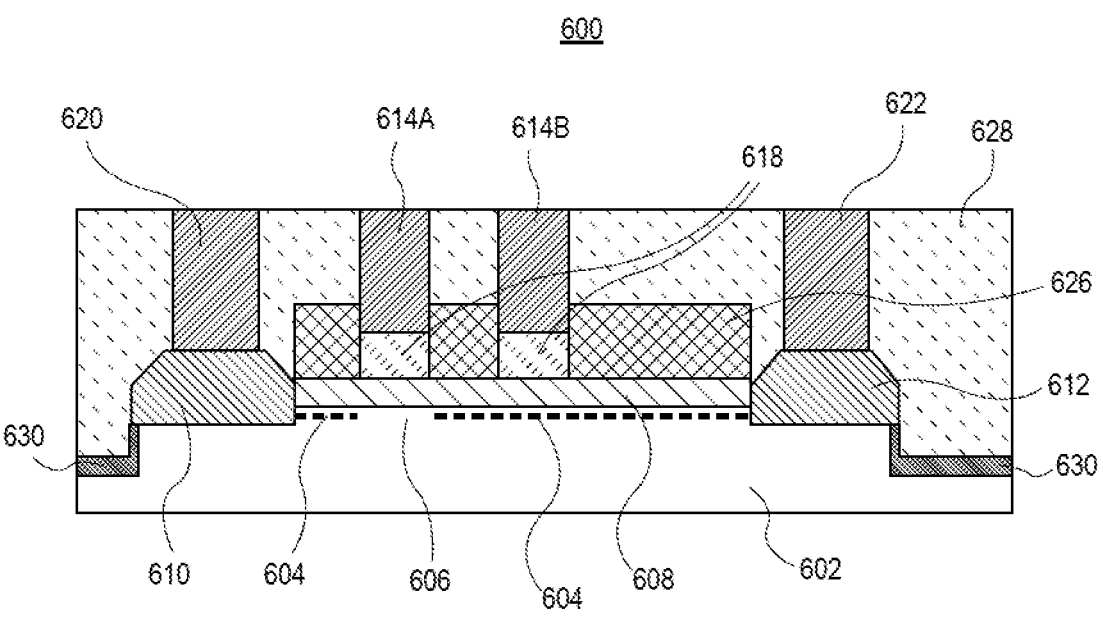
FIG. 6 illustrates cross-sectional views of various structural options for a high voltage scaled GaN device with multi-gate technology, in accordance with another embodiment of the present disclosure.

FIG. 6 illustrates cross-sectional views of various structural options for a high voltage scaled GaN device with multi-gate technology, in accordance with another embodiment of the present disclosure. Such a device can be fabricated to include a source field plate such as described above, or can be integrated with a device including a source field plate such as described above.

Referring to FIG. 6, a high voltage scaled GaN device 600 includes a GaN layer 602 including 2DEG regions 604 and non 2DEG regions 606. N+ InGaN source or drain regions 610 and 612 are on the GaN layer 602. A p-GaN, p-InGaN, p-AlGaN regrown layer 618 is on the polarization layer 608 to provide a field-redistribution effect. Gate electrodes 614A and 614B are on the p-GaN, p-InGaN, p-AlGaN regrown layer 618. Source or drain contacts 620 and 622 are on the N+ InGaN source or drain regions 610 and 612. An insulator layer 626, such as a silicon nitride (SiN) layer is included over the polarization layer 608. An inter-layer dielectric (ILD) layer 628 is over the structure. An H2-implant shallow-trench isolation layer 630 is on either side of the N+ InGaN source or drain regions 610 and 612.

In an embodiment, multi-gates can extend the voltage handling capability and incur minimal increase in on-resistance and transistor drive current. Multi-gates also improve drain induced barrier leakage (DIBL), and reduce off-state leakage.

Figure 7:
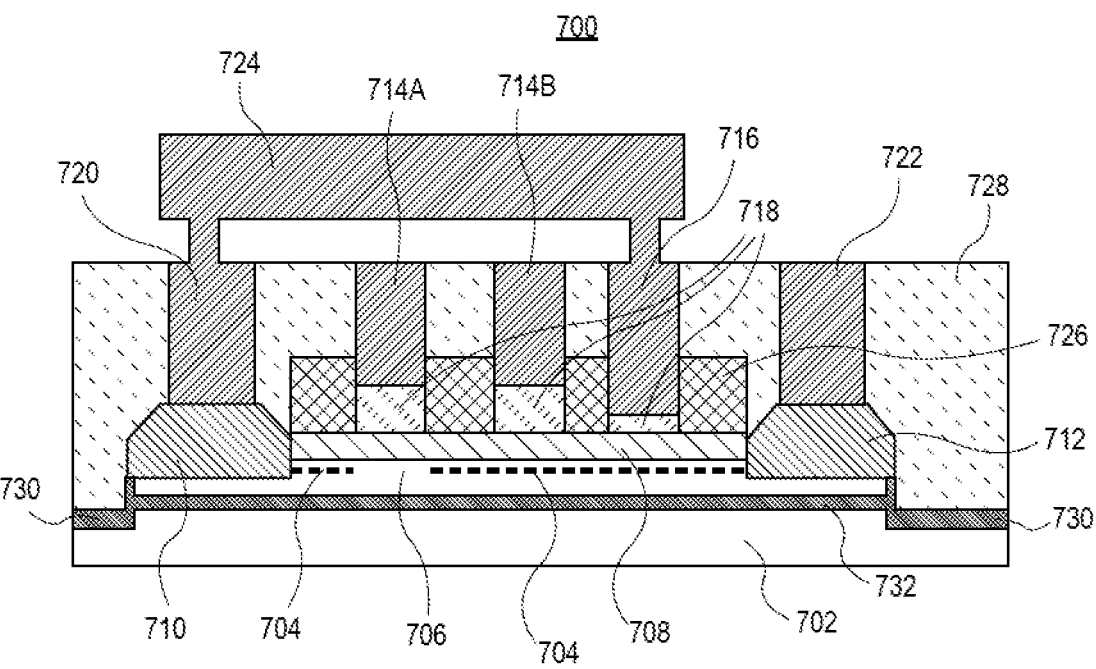
FIG. 7 illustrates cross-sectional views of various structural options for a high voltage scaled GaN device with multi-gate technology, in accordance with another embodiment of the present disclosure.

FIG. 7 illustrates cross-sectional views of various structural options for a high voltage scaled GaN device with multi-gate technology, in accordance with another embodiment of the present disclosure. Such a device can be fabricated to include a source field plate such as described above, or can be integrated with a device including a source field plate such as described above.

Referring to FIG. 7, a high voltage scaled GaN device 700 includes a GaN layer 702 including 2DEG regions 704 and non 2DEG regions 706. N+ InGaN source or drain regions 710 and 712 are on the GaN layer 702. A p-GaN, p-InGaN, p-AlGaN regrown layer 718 is on the polarization layer 708 to provide a field-redistribution effect. Gate electrodes 714A and 714B and a field plate electrode 716 are on the p-GaN, p-InGaN, p-AlGaN regrown layer 718. Source or drain contacts 720 and 722 are on the N+ InGaN source or drain regions 710 and 712. An interconnect line 724 couples the source or drain contact 720 and field plate electrode 716. An insulator layer 726, such as a silicon nitride (SiN) layer is included over the field plating layer 708. An inter-layer dielectric (ILD) layer 728 is over the structure. An H2-implant shallow-trench isolation layer 730 is on either side of the N+ InGaN source or drain regions 710 and 712. An H2-implant region 732 is under a channel region of the device 700.

In an embodiment, aside from providing a field-plate (FP) to redistribute the high lateral electric field on the drain side of the transistor, a p-GaN/p-InGaN/p-AlGaN field plate can inject compensating holes into the channel in the drain region to neutralized electrons that are trapped in the high field region on the drain side. High energy hydrogen atoms can be implanted in the shallow-trench isolation region to further isolate each GaN transistor active region from the rest of the wafer. Further, a hydrogen implant plane can be achieved underneath the GaN 2DEG for further isolation of GaN transistor active region from the GaN buffer and substrate. In one embodiment, voltage converter circuit topologies enabled by these devices include LLC resonant converter, switched capacitor converters, buck converters, and others.

Embodiments of the disclosure relate to gallium nitride (GaN) transistors having multiple threshold voltages and their methods of fabrication. A GaN transistor, in accordance with embodiments, includes a gallium nitride layer above a substrate, such as a silicon monocrystalline substrate. A gate stack is disposed above the GaN layer. A source region and a drain region are disposed on opposite sides of the gate stack. A polarization layer including a group III-N semiconductor is disposed on the GaN layer and beneath the gate stack. The polarization layer may have a first thickness, including a zero thickness, beneath a first gate portion of the gate stack and a second thickness greater than the first thickness beneath a second gate portion of the gate stack. The thickness of the polarization layer or lack of a polarization layer beneath the gate stack affects the threshold voltage of the overlying portion of the gate stack. By providing different thicknesses of the polarization layer beneath different portions of the gate stack, a transistor may be engineered to have two or more different threshold voltages. In an embodiment, a transistor has a threshold voltage in the range of 1V to −6V. A GaN transistor having multiple threshold voltages may be fabricated as a planar transistor or a nonplanar transistor. In embodiments of the present disclosure, a GaN transistor having two or more threshold voltages may be used to create a hybrid class A+AB power amplifier with improved linearity.

Figure 8A:
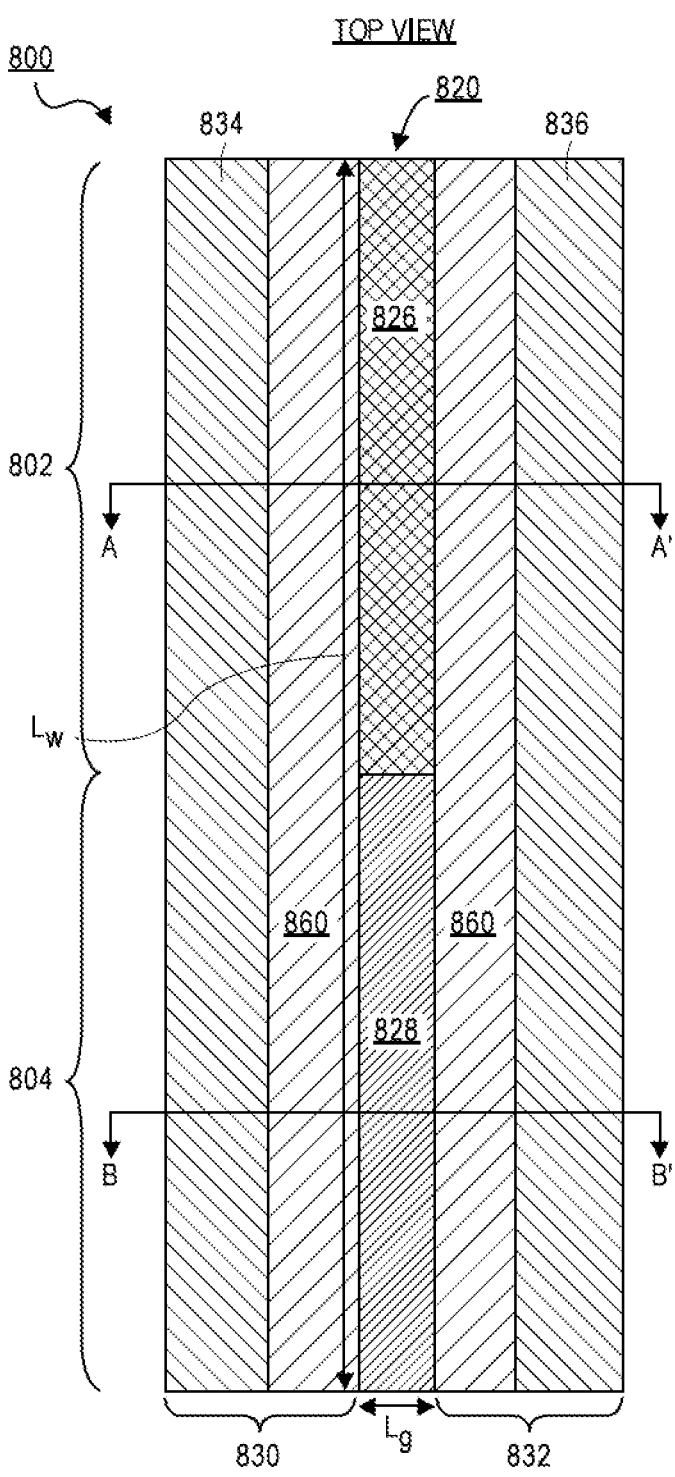
FIGS. 8A-8C illustrate a GaN transistor in accordance with embodiments of the present disclosure.
Figure 8B:
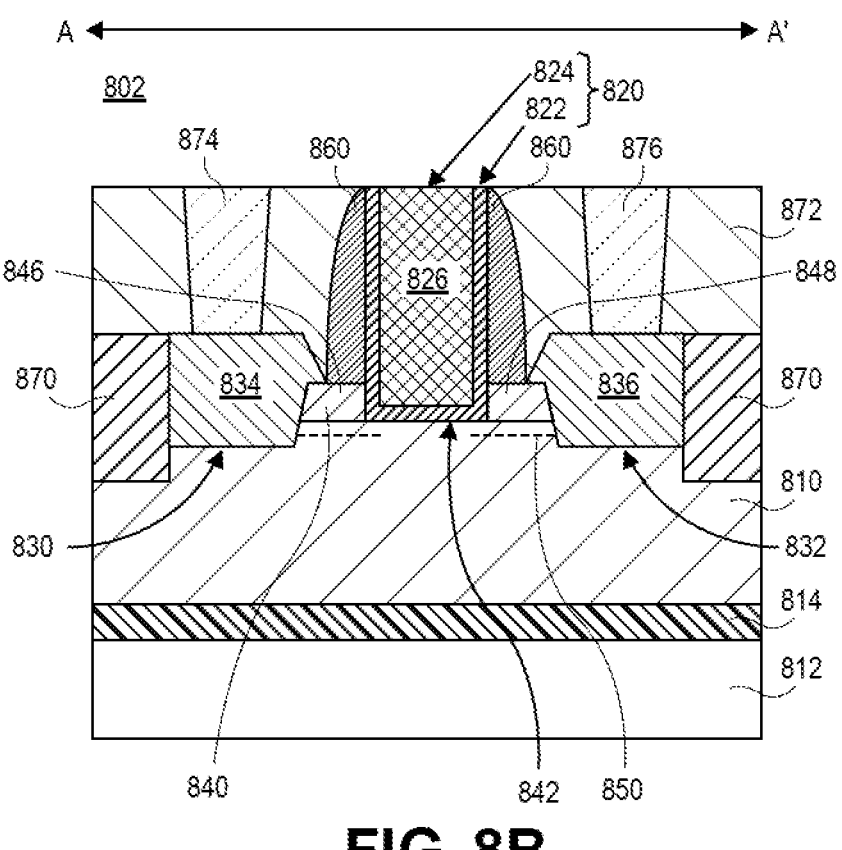
Figure 8C:
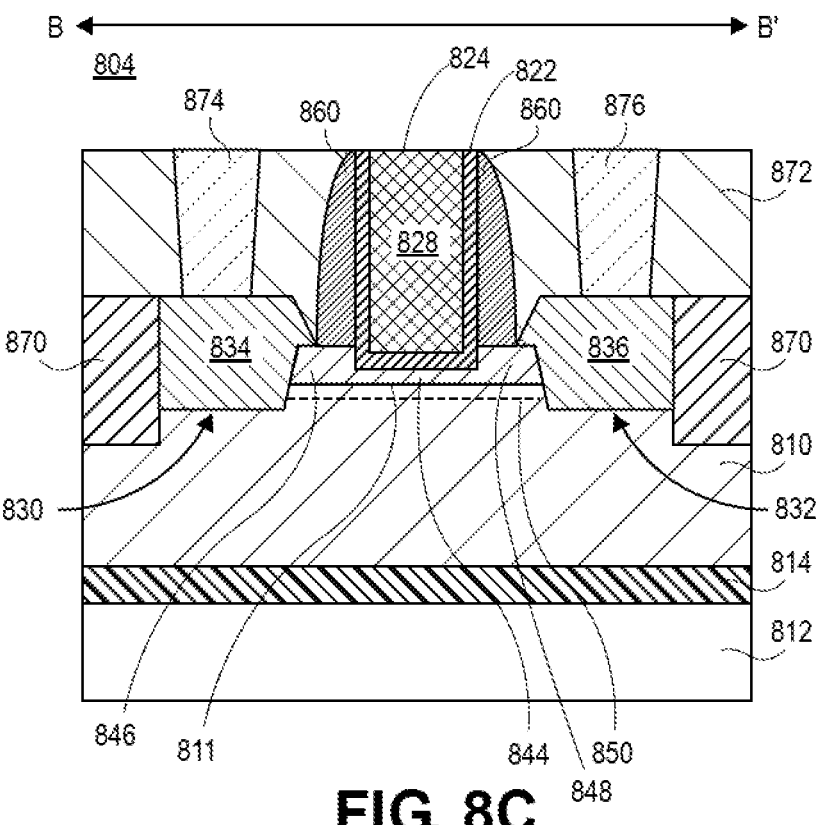

FIGS. 8A-8C illustrate a GaN transistor 800 in accordance with embodiments of the present disclosure. FIG. 8A is a top down view illustrating GaN transistor 800 while FIG. 8B is as cross-sectional view taken through a first portion 802 of transistor 800 and FIG. 8C is a cross-sectional view taken through a section of portion 804 of transistor 800. Transistor 800 includes a gallium nitride (GaN) layer 810 disposed above a substrate 812, such as but not limited to a silicon monocrystalline substrate. A buffer layer 814, such as an aluminum nitride (AlN) layer, may be disposed between substrate 812 and GaN layer 810. GaN layer 810 provides a channel layer for transistor layer 800. A gate stack 820 is disposed above the GaN layer 810 as illustrated in FIGS. 8B and 8C. The gate stack may include a gate dielectric 822 and a gate electrode 824 with the gate dielectric 822 between the gate electrode 824 and GaN layer 810. In an embodiment, the gate dielectric 822 is a high-k gate dielectric such as but not limited to a hafnium oxide (e.g., $HfO_2$) or aluminum oxide (e.g., $Al_2O_3$) gate dielectric layer. Such devices can be fabricated to include a source field plate such as described above, or can be integrated with a device including a source field plate such as described above.

A source region 830 and a drain region 832 may be disposed on opposite sides of gate stack 820 as illustrated in FIGS. 8A-8C. In an embodiment source region 830 includes a group III-N semiconductor contact 834, such as but not limited to InGaN, and drain region 832 includes a group III-N semiconductor contact 836. In an embodiment, group III-N semiconductor contacts 834 and 836 are a single crystalline group III-N semiconductor, and may be doped to an N+ conductivity (e.g., greater than 1E18 concentration) with, e.g., silicon. Transistor 800 has a gate length (Lg) which extends in a first direction between source region 830 and drain region 832. When transistor 800 is in an "ON" state current flows between source region 830 and drain region 832 in the first direction. Transistor 800 has a gate width (Gw) in a second direction, perpendicular to the first direction or to the gate length direction, and parallel to the source and drain regions 830 and 832 as illustrated in FIG. 8A. In an embodiment, the gate width of transistor 800 is between 10 and 100 microns.

Transistor 800 includes a polarization layer 840. In an embodiment, polarization layer 840 is a group III-N semiconductor, such as but not limited to a group III-N semiconductor including aluminum, gallium, indium and nitrogen or $Al_xIn_yGa_{1-x-y}N$ (0<x<=1, 0<=y<1). In an embodiment, x=0.83 and y=0.17, where $Al_{0.83}In_{0.17}N$ is lattice-matched to GaN. In an embodiment, the polarization layer 840 is disposed directly on a surface 811 of GaN layer 810 which is a (0001) plane or a C-plane of gallium nitride. Depending on the composition and thickness of polarization layer 840, polarization layer 840 may create a 2DEG layer 850 in the top surface of GaN layer 810 as illustrated in FIGS. 8B and 8C.

In an embodiment of the present disclosure, a first portion 802 of transistor 800 has a first gate portion 826 of gate stack 820 disposed over a first portion 842 of polarization layer 840 having a first thickness, which may be a zero thickness, while a second portion 804 of transistor 800 has a second gate portion 828 of gate stack 820 disposed over a second portion 844 of polarization layer 840 having a second thickness, wherein the second thickness is greater than the first thickness. The difference in thicknesses between the first portion 842 and the second portion 844 of polarization layer 840 creates a difference in the threshold voltages for the first gate portion 826 of gate stack 820 and the second gate portion 828 of gate stack 820 where the threshold voltage (VT1) of the first gate portion 826 is greater than the threshold voltage (VT2) of the second gate portion 828. In an embodiment, the first threshold voltage (VT1) is greater than the second threshold voltage (VT2) by an amount in the range of 100 mV to 9V. In an embodiment, the first threshold voltage (VT1) is greater than the second threshold voltage (VT2) by greater than 2V.

In a specific embodiment, as shown in FIGS. 8B and 8C, the first portion 842 of polarization layer 840 has a thickness of zero. That is, there is no polarization layer 840 beneath the first gate portion 826 of gate stack 820 and the first gate portion 826 is disposed directly on GaN layer 810 as illustrated in FIG. 8B. Second portion 844 of polarization layer 840 has a non-zero thickness beneath the second gate portion 828 of gate stack 820. In an embodiment, second portion 844 of polarization layer 840 is sufficiently thick to create a 2DEG layer in the top surface of GaN layer 810 beneath second gate portion 828 of gate stack 820. In this way, the first portion 826 of gate stack 820 has a threshold voltage (VT1) which is greater than the threshold voltage (VT2) of the second gate portion 828 of gate stack 820. In an alternative embodiment, first portion 842 of polarization layer 840 has a zero thickness, and the second portion has a non-zero thickness, which is not sufficiently thick to create a 2DEG layer in GaN layer 810 beneath second gate portion 828 of gate stack 820. Although, a 2DEG is not formed beneath the second gate portion 828 of gate stack 820 in an embodiment, the second portion 828 of gate stack 820 may still have a lower threshold voltage (VT2) than the threshold voltage (VT1) of the first gate portion 826 of gate stack 820 disposed directly on GaN layer 810.

In the embodiment, the first portion 842 and the second portion 844 of polarization layer 840 both have a non-zero thickness. In an embodiment, the first portion 842 has a first non-zero thickness and a second portion 844 has a second non-zero thickness greater than the first thickness, wherein the first portion 842 is not sufficiently thick to create a 2DEG layer in GaN layer 810 beneath first gate portion 826 and wherein the second portion 844 of polarization layer 840 is also not sufficiently thick to create a 2DEG layer in GaN layer 810 beneath second gate portion 828. In yet another embodiment, the second portion 844 of polarization layer 840 is thicker than the first portion 842 of polarization layer 840 and the first portion 842 and the second portion 844 are each sufficiently thick to create a 2DEG layer in GaN layer 810 beneath first gate portion 826 and second gate portion 828, respectively. In an embodiment, the second portion 844 of polarization layer 840 is approximately 2-3 times thicker than the first portion 842 of polarization layer 840. In a specific embodiment, the first portion 842 of polarization layer 840 includes a 1 nanometer AlN layer on the GaN layer 810 and a 1 nanometer AlInN layer on the 1 nanometer AlN layer, and the second portion 844 of polarization layer 840 includes a 1 nanometer AlN layer on the GaN layer 810 and a 3 nanometer AlInN layer on the 1 nanometer AlN layer. In an embodiment, in either case, the AlInN layer includes $Al_{0.83}In_{0.17}N$.

In another embodiment, first portion 842 of polarization layer 840 has a non-zero thickness that is insufficient to create a 2DEG layer in GaN layer 810 beneath first gate portion 826 and wherein the second portion 844 of polarization layer 840 has a thickness greater than the thickness of the first polarization layer 842 and is sufficient to create a 2DEG layer in GaN layer 810 beneath second gate portion 828.

It is to be appreciated, in embodiment of the present disclosure, polarization layer 840 may have a third portion beneath a third gate portion wherein the third portion of the polarization layer 840 has a thickness greater than the thickness of the second portion 844 of polarization layer 840 which is yet thicker than the first portion 842 of polarization layer 840. In this way, a transistor having three different threshold voltages may be obtained. A similar technique may be practiced to create a GaN transistor with four or more threshold voltages, if desired.

In an embodiment, transistor 800 includes a pair of insulative sidewall spacers 860 disposed on opposite sides of gate stack 820 as illustrated in FIGS. 8B and 8C. Sidewall spacers may be formed from any well-known material, such as but no limited to silicon oxide, silicon nitride, and silicon oxynitride. One of the sidewall spacers of the pair of sidewall spacers 860 is disposed on a source portion 846 of polarization layer 840 between gate stack 820 and source group III-N semiconductor contact 834. The other sidewall spacer of the pair of sidewall spacers 860 is disposed on a drain portion 848 of polarization layer 840 disposed between gate stack 820 and drain group III-N semiconductor contact 836. In an embodiment, source polarization layer 846 creates a 2DEG layer 850 in the top surface of GaN layer 810 and drain polarization layer 848 creates a 2DEG layer 850 in the top surface of GaN layer 810 as illustrated in FIGS. 8B and 8C. In embodiments of the present disclosure, source polarization layer 846 and drain polarization layer 848 have a thickness greater than the thickness of the second portion 844 of polarization layer 840 and greater than the thickness of the first portion 842 of polarization layer 840 which may be a zero thickness.

In an embodiment of the present disclosure, the first transistor portion 802 and the second transistor portion 804 have the same gate width. In other embodiments, the first transistor portion 802 has a greater or smaller gate width than second transistor portion 804. In this way, the amount of current provided by the first transistor portion may differ from the amount of current provided by the second transistor portion 804.

In embodiments of the present disclosure, isolation regions 870 may be formed in GaN layer 810. Isolation regions 870 may surround transistor 800 to isolate transistor 800 from other devices manufactured in GaN 810 and/or substrate 812. An interlayer dielectric 872, such as but not limited to, silicon dioxide and carbon doped silicon oxide, may be disposed over transistor 800. Contacts 874 and 876, such as metal contacts, may be disposed in dielectric 872 to create electrical contacts to source group III-N semiconductor contact 834 and to drain group III-N semiconductor contact 836, respectively, as illustrated in FIGS. 8B and 8C.

Figure 9:
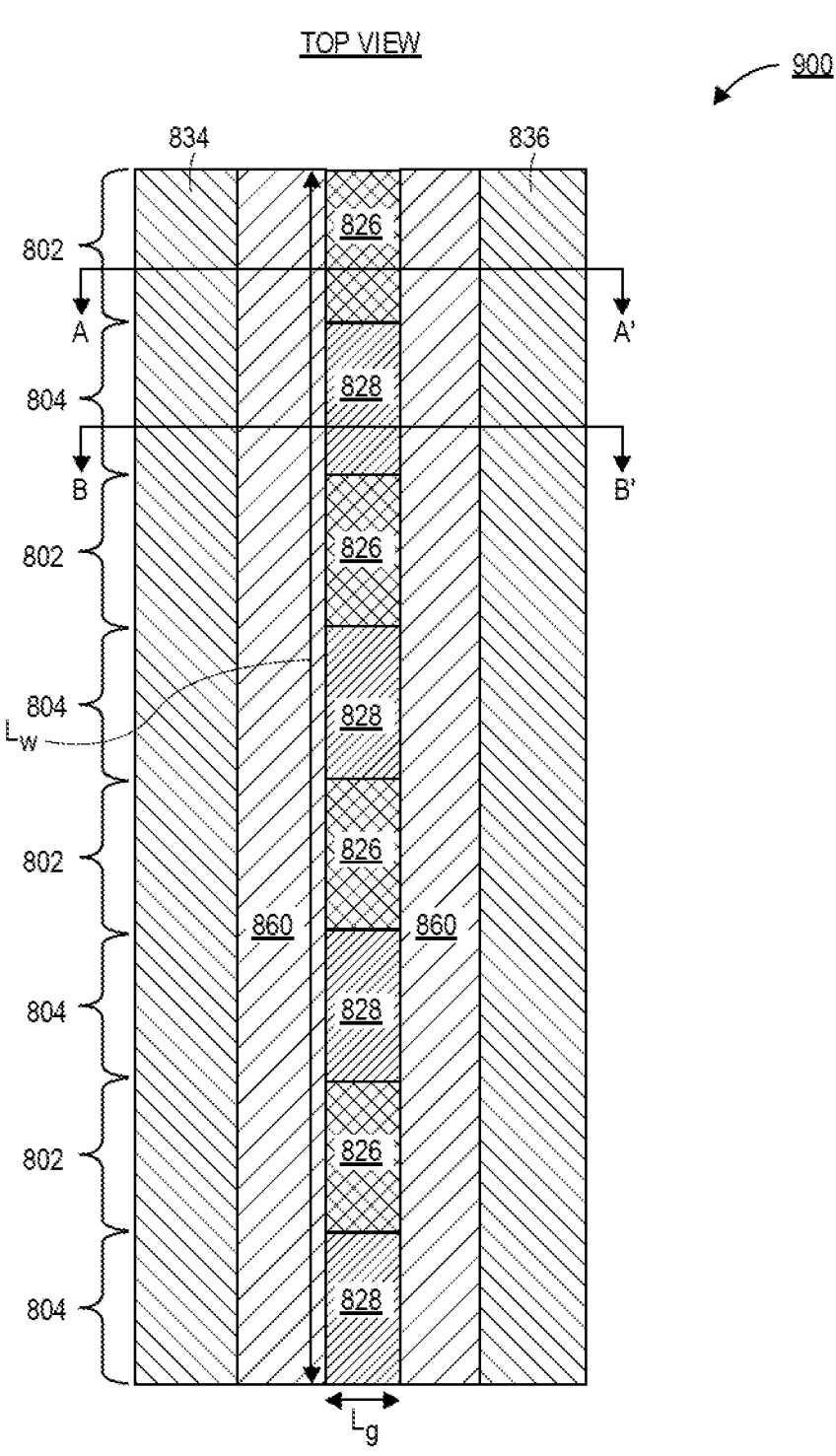
FIG. 9 illustrates a GaN transistor having multiple threshold voltages in accordance with an embodiment of the present disclosure.

FIG. 9 illustrates a GaN transistor 900 having multiple threshold voltages in accordance with an embodiment of the present disclosure. GaN transistor 900 includes a plurality of first transistor portions 802 and a plurality of second transistor portions 804 along the gate width (Gw) direction of transistor 900 as illustrated in FIG. 9. Each of the first transistor portions 802 and each of the second transistor portions 804 may include transistor structures as illustrated and described with respect to FIGS. 8B and 8C, respectively. That is, in an embodiment, each first transistor portion 802 of the plurality of first transistor portions includes a first portion 842 of polarization layer 840 having a first thickness, including possibly a zero thickness, and each second transistor portion 804 of the plurality of second transistor portions includes a second portion 844 of polarization layer 840 having a second thickness wherein the second thickness is greater than the first thickness. In an embodiment, the first transistor portions 802 and the second transistor portions 804 of GaN transistor 900 alternate or interleave with one another along the gate width (Gw) direction of FIG. 9. In an embodiment, transistor 900 includes two first transistor portions 802 and two second transistor portion 804. In another embodiment, transistor 900 includes three first transistor portions 802 and three second transistor portions 804. In yet another embodiment, transistor 900 includes three or more first transistors portions 802 and three or more second transistor portions 804. In embodiments, transistor 900 has more first transistor portions 802 than second transistor portions 804. In yet another embodiment, transistor 900 has more second transistor portions 804 than first transistor portions 802. In an embodiment, interleaving provides a plurality of parallel channels for transistor 900. Such a device can be fabricated to include a source field plate such as described above, or can be integrated with a device including a source field plate such as described above.

Figure 10:
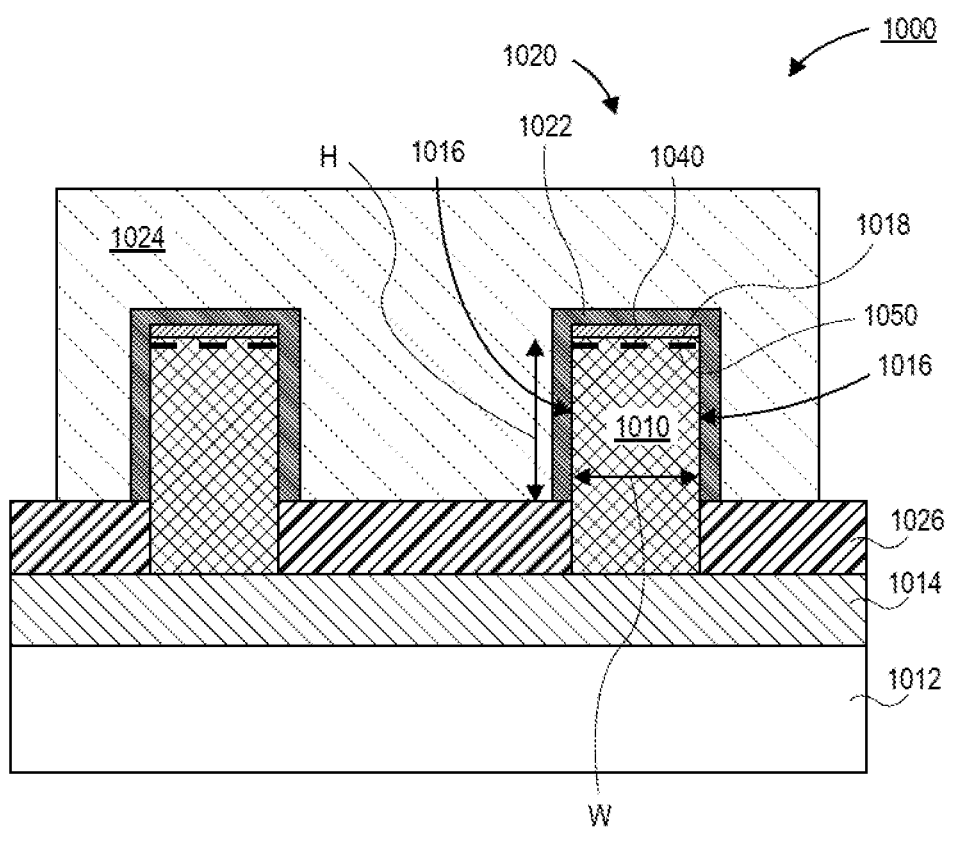
FIG. 10 illustrates a cross-sectional view of a nonplanar or tri-gate GaN transistor having multiple threshold voltages in accordance with embodiments of the present disclosure.

FIG. 10 illustrates a cross-sectional view of a nonplanar or tri-gate GaN transistor 1000 having multiple threshold voltages in accordance with embodiments of the present disclosure. Transistor 1000 includes a GaN fin 1010 disposed above a substrate 1012, such as but not limited to a monocrystalline silicon substrate, silicon carbide substrate, or a sapphire substrate. A buffer layer 1014 may be disposed between GaN fin 1010 and substrate 1012. Fin 1010 has a pair of laterally opposite sidewalls 1016 and a top surface 1018 between the laterally opposite sidewalls. In an embodiment, top surface 1018 of GaN fin 1010 is a (1000) plane or a c-plane of GaN. An oxide layer 1026, such as an oxide of a shallow trench isolation (STI) may be disposed above substrate 1012 and may surround a bottom portion of fin 1010, so that an upper portion of fin 1010 extends above oxide layer 1026 as illustrated in FIG. 10. Such a device can be fabricated to include a source field plate such as described above, or can be integrated with a device including a source field plate such as described above.

A polarization layer 1040 is disposed on the top surface 1018 of fin 1010. In an embodiment, polarization layer 1010 is a group III-N semiconductor material, such as but not limited to AlGaInN, AlGaN, and AlInN. In an embodiment polarization layer 1040 is not formed on sidewall 1016 of fin 1010. A gate stack 1020 is disposed over polarization layer 1040 on the top surface 1018 of fin 1010 and is disposed over the sidewalls 1016 of fin 1010 as illustrated in FIG. 10. Gate stack 1020 may include a gate dielectric 1022, such as but not limited to hafnium oxide (e.g. $HfO_2$) or aluminum oxide (e.g. $Al_2O_3$) and a gate electrode 1024 such as a metal gate electrode. Gate dielectric 1022 may be disposed between gate electrode 1024 and sidewalls 1016 of gate electrode 1024 and between gate electrode 1024 and polarization layer 1040 on the top surface of GaN fin 1010. A source region and a drain region (not shown) may be disposed on opposite sides (into and out of the page) of the gate stack 1020 as is well-known in the art. The source and drain regions each may include a group III-N semiconductor contact, such as but not limited to InGaN.

In an embodiment, polarization layer 1040 is of a sufficient thickness to create a 2DEG layer in the top surface of fin 1010 as illustrated in FIG. 10. In an alternative embodiment, polarization layer 1040 has a thickness which is insufficient to create a 2DEG layer in the top surface of fin

1010, however, is of a sufficient thickness in order to provide a different threshold voltage for the portion of the gate stack 1020 over the top surface 1018 of fin 1010 relative to the threshold voltage of the gate stack 1020 adjacent to the sidewalls 1016 of fin 1010. In either case, transistor 1000 has two different threshold voltages, a first threshold voltage (VT1) associated with a portion of the gate stack 1020 over/adjacent to the sidewalls 1016 of fin 1010 and second threshold voltage (VT2), such as a lower threshold voltage, associated with the portion of the gate stack 1020 over polarization layer 1040 and top surface 1018 of fin 1010. The width (W) of and the height (H) of the portion of fin 1010 may be chosen to create the desired amount of current provided by the top surface 1018 of fin 1010 relative to the sidewalls 1016 of fin 1010. In an embodiment, an additional fin or fins including a top polarization layer may be included to increase the current carrying capability of transistor 1000, an example of which is shown in FIG. 10.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, a FIN-FET, a nanowire, or a nanoribbon.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that the layers and materials described above in association with back-end-of-line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material.

Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
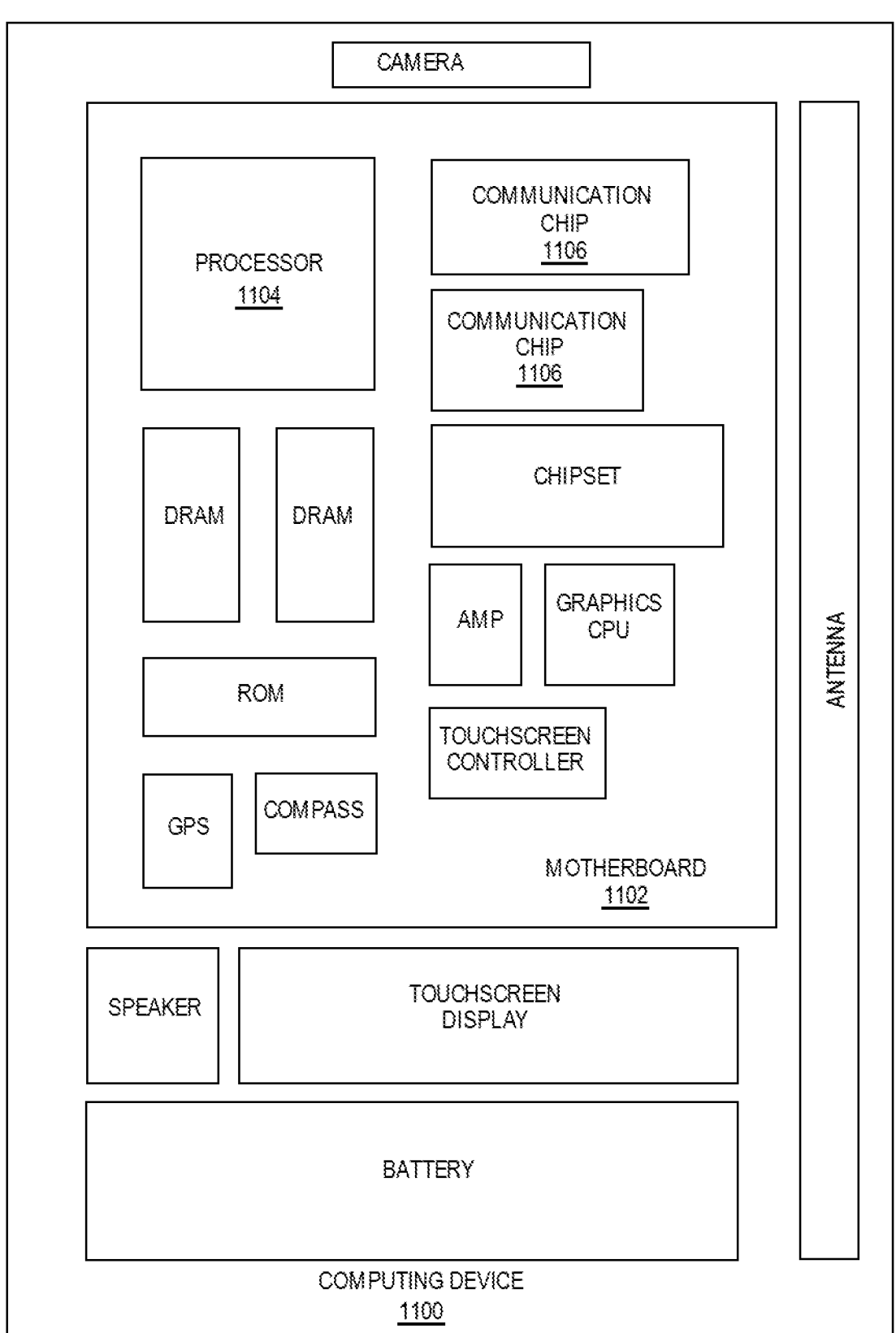
FIG. 11 illustrates a computing device in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106 and/or at least one power delivery chip (not depicted). The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1106 also includes an integrated circuit die packaged within the communication chip 1106. In accordance with another implementation of the disclosure, the integrated circuit die of the communication chip is built in accordance with implementations of the disclosure.

In further implementations, another component housed within the computing device 1100 may contain an integrated circuit die built in accordance with implementations of embodiments of the disclosure.

In various embodiments, the computing device 1100 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
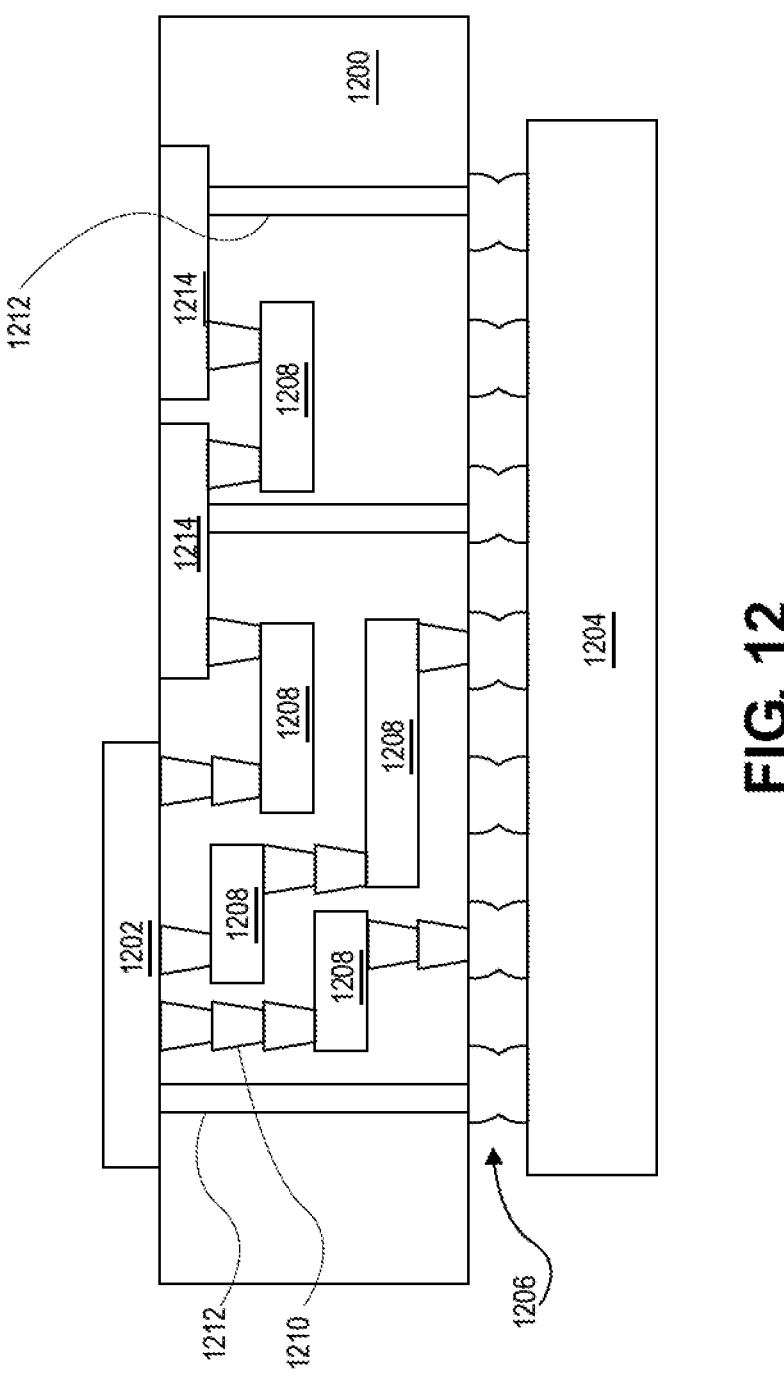
FIG. 12 illustrates an interposer that includes one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer 1200 may be formed of alternate rigid or flexible materials that may include the same materials described above for use in a semiconductor substrate, such as silicon, germanium, and other group III-V and group IV materials.

The interposer 1200 may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200 or in the fabrication of components included in the interposer 1200.

Figure 13:
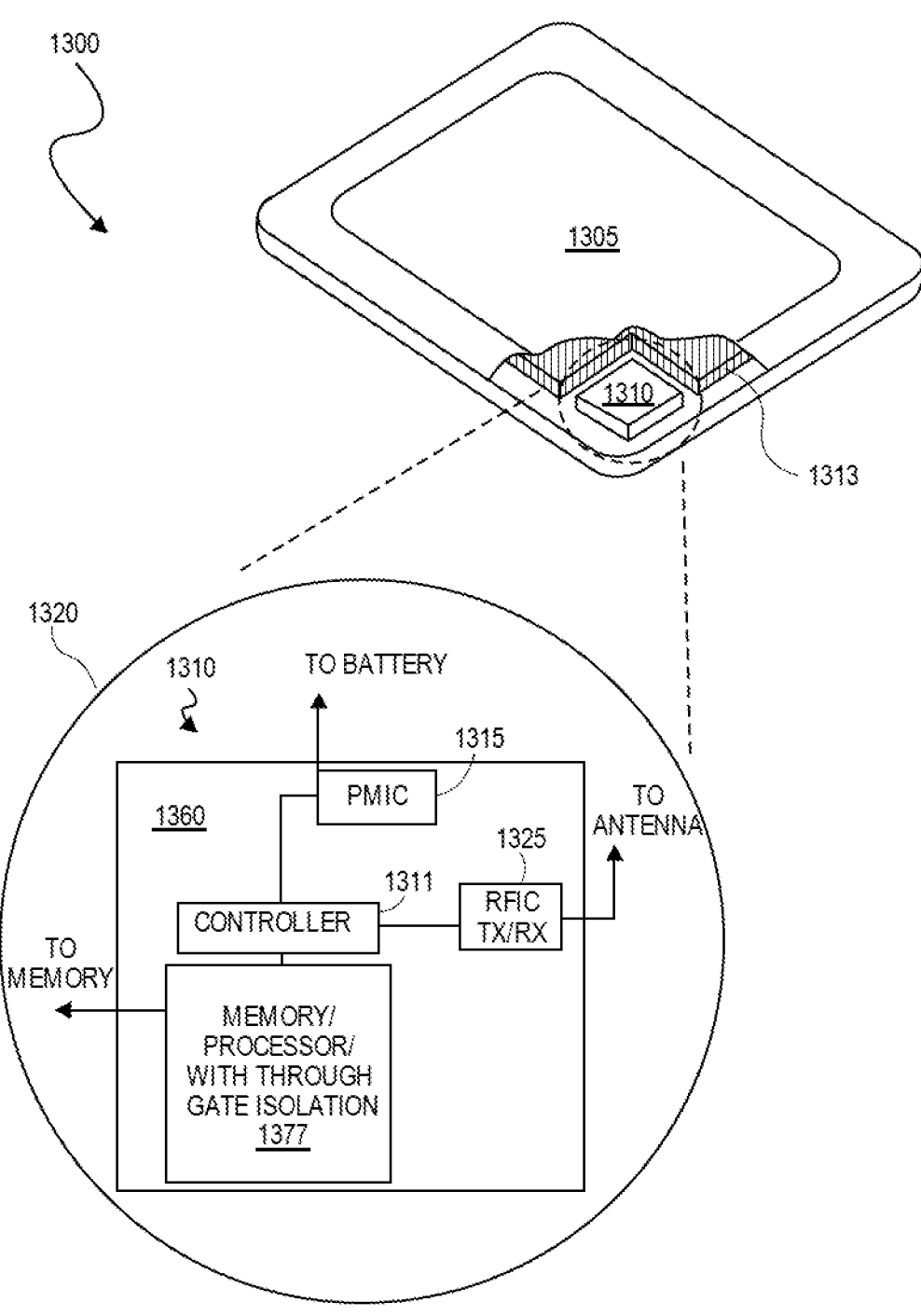
FIG. 13 is an isometric view of a mobile computing platform employing an IC fabricated according to one or more processes described herein or including one or more features described herein, in accordance with an embodiment of the present disclosure.

FIG. 13 is an isometric view of a mobile computing platform 1300 employing an integrated circuit (IC) fabricated according to one or more processes described herein or including one or more features described herein, in accordance with an embodiment of the present disclosure.

The mobile computing platform 1300 may be any portable device configured for each of electronic data display, electronic data processing, and wireless electronic data transmission. For example, mobile computing platform 1300 may be any of a tablet, a smart phone, laptop computer, etc. and includes a display screen 1305 which in the exemplary embodiment is a touchscreen (capacitive, inductive, resistive, etc.), a chip-level (SoC) or package-level integrated system 1310, and a battery 1313. As illustrated, the greater the level of integration in the system 1310 enabled by higher transistor packing density, the greater the portion of the mobile computing platform 1300 that may be occupied by the battery 1313 or non-volatile storage, such as a solid state drive, or the greater the transistor gate count for improved platform functionality. Similarly, the greater the carrier mobility of each transistor in the system 1310, the greater the functionality. As such, techniques described herein may enable performance and form factor improvements in the mobile computing platform 1300.

The integrated system 1310 is further illustrated in the expanded view 1320. In the exemplary embodiment, packaged device 1377 includes at least one memory chip (e.g., RAM), or at least one processor chip (e.g., a multi-core microprocessor and/or graphics processor) fabricated according to one or more processes described herein or including one or more features described herein. The packaged device 1377 is further coupled to the board 1360 along with one or more of a power management integrated circuit (PMIC) 1315, RF (wireless) integrated circuit (RFIC) 1325 including a wideband RF (wireless) transmitter and/or receiver (e.g., including a digital baseband and an analog front end module further includes a power amplifier on a transmit path and a low noise amplifier on a receive path), and a controller thereof 1311. Functionally, the PMIC 1315 performs battery power regulation, DC-to-DC conversion, etc., and so has an input coupled to the battery 1313 and with an output providing a current supply to all the other functional modules. As further illustrated, in the exemplary embodiment, the RFIC 1325 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1377 or within a single IC (SoC) coupled to the package substrate of the packaged device 1377.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include gallium nitride (GaN) devices with through-silicon vias for integrated circuit technology.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a layer including gallium and nitrogen, the layer including gallium and nitrogen above a silicon substrate. A backside structure is below the silicon substrate and opposite the layer including gallium and nitrogen, the backside structure including conductive features and dielectric structures. The integrated circuit structure also includes a plurality of through-silicon via power bars having a staggered arrangement, individual ones of the through-silicon via power bars extending through the layer including gallium and nitrogen and through the silicon substrate to a corresponding one of the conductive features of the backside structure, and individual ones of the through-silicon via power bars having a tapered portion coupled to an essentially vertical portion.

Example embodiment 2: The integrated circuit structure of example embodiment 1, wherein the essentially vertical portion is in the layer including gallium and nitrogen, and the tapered portion is in the silicon substrate.

Example embodiment 3: The integrated circuit structure of example embodiment 1 or 2, wherein the tapered portion is defined by Si(111) crystal planes.

Example embodiment 4: The integrated circuit structure of example embodiment 1, 2 or 3, wherein individual ones of the through-silicon via power bars include a dielectric liner and a copper fill.

Example embodiment 5: The integrated circuit structure of example embodiment 1, 2, 3 or 4, further including a layer including conductive features above the layer including gallium and nitrogen, wherein individual ones of the through-silicon via power bars extend to a corresponding one of the conductive features of the layer.

Example embodiment 6: A computing device includes a board, and a component coupled to the board. The component includes an integrated circuit structure including a layer including gallium and nitrogen, the layer including gallium and nitrogen above a silicon substrate. A backside structure is below the silicon substrate and opposite the layer including gallium and nitrogen, the backside structure including conductive features and dielectric structures. The integrated circuit structure also includes a plurality of through-silicon via power bars having a staggered arrangement, individual ones of the through-silicon via power bars extending through the layer including gallium and nitrogen and through the silicon substrate to a corresponding one of the conductive features of the backside structure, and individual ones of the through-silicon via power bars having a tapered portion coupled to an essentially vertical portion.

Example embodiment 7: The computing device of example embodiment 6, further including a memory coupled to the board.

Example embodiment 8: The computing device of example embodiment 6 or 7, further including a communication chip coupled to the board.

Example embodiment 9: The computing device of example embodiment 6, 7 or 8, further including a camera coupled to the board.

Example embodiment 10: The computing device of example embodiment 6, 7, 8 or 9, wherein the component is a packaged integrated circuit die.

Example embodiment 11: An integrated circuit structure includes a layer including gallium and nitrogen, the layer including gallium and nitrogen above a silicon substrate. A backside structure is below the silicon substrate and opposite the layer including gallium and nitrogen, the backside structure including conductive features and dielectric structures. The integrated circuit structure also includes a waveguide structure including a plurality of through-silicon vias having a co-planar arrangement, individual ones of the through-silicon vias extending through the layer including gallium and nitrogen and through the silicon substrate to a corresponding one of the conductive features of the backside structure, and individual ones of the through-silicon vias having a tapered portion coupled to an essentially vertical portion.

Example embodiment 12: The integrated circuit structure of example embodiment 11, wherein the essentially vertical portion is in the layer including gallium and nitrogen, and the tapered portion is in the silicon substrate.

Example embodiment 13: The integrated circuit structure of example embodiment 11 or 12, wherein the tapered portion is defined by Si(111) crystal planes.

Example embodiment 14: The integrated circuit structure of example embodiment 11, 12 or 13, wherein individual ones of the through-silicon vias include a dielectric liner and a copper fill.

Example embodiment 15: The integrated circuit structure of example embodiment 11, 12, 13 or 14, further including a layer including conductive features above the layer including gallium and nitrogen, wherein individual ones of the through-silicon vias extend to a corresponding one of the conductive features of the layer.

Example embodiment 16: A computing device includes a board, and a component coupled to the board. The component includes an integrated circuit structure including a layer including gallium and nitrogen, the layer including gallium and nitrogen above a silicon substrate. A backside structure is below the silicon substrate and opposite the layer including gallium and nitrogen, the backside structure including conductive features and dielectric structures. The integrated circuit structure also includes a waveguide structure including a plurality of through-silicon vias having a co-planar arrangement, individual ones of the through-silicon vias extending through the layer including gallium and nitrogen and through the silicon substrate to a corresponding one of the conductive features of the backside structure, and individual ones of the through-silicon vias having a tapered portion coupled to an essentially vertical portion.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
a layer comprising gallium and nitrogen, the layer comprising gallium and nitrogen above a silicon substrate;
a backside structure below the silicon substrate and opposite the layer comprising gallium and nitrogen, the backside structure including conductive features and dielectric structures; and
a plurality of through-silicon via power bars having a staggered arrangement, individual ones of the through-silicon via power bars extending through the layer comprising gallium and nitrogen and through the silicon substrate to a corresponding one of the conductive features of the backside structure, and individual ones of the through-silicon via power bars having a tapered portion coupled to an essentially vertical portion.

2. The integrated circuit structure of claim 1, wherein the essentially vertical portion is in the layer comprising gallium and nitrogen, and the tapered portion is in the silicon substrate.

3. The integrated circuit structure of claim 1, wherein the tapered portion is defined by Si(111) crystal planes.

4. The integrated circuit structure of claim 1, wherein individual ones of the through-silicon via power bars comprise a dielectric liner and a copper fill.

5. The integrated circuit structure of claim 1, further comprising a layer comprising conductive features above the layer comprising gallium and nitrogen, wherein individual ones of the through-silicon via power bars extend to a corresponding one of the conductive features of the layer.

6. A computing device, comprising:
a board; and
a component coupled to the board, the component including an integrated circuit structure, comprising:
a layer comprising gallium and nitrogen, the layer comprising gallium and nitrogen above a silicon substrate;
a backside structure below the silicon substrate and opposite the layer comprising gallium and nitrogen, the backside structure including conductive features and dielectric structures; and
a plurality of through-silicon via power bars having a staggered arrangement, individual ones of the through-silicon via power bars extending through the layer comprising gallium and nitrogen and through the silicon substrate to a corresponding one of the conductive features of the backside structure, and individual ones of the through-silicon via power bars having a tapered portion coupled to an essentially vertical portion.

7. The computing device of claim 6, further comprising:
a memory coupled to the board.

8. The computing device of claim 6, further comprising:
a power delivery chip coupled to the board.

9. The computing device of claim 6, further comprising:
a camera coupled to the board.

10. The computing device of claim 6, wherein the component is a packaged integrated circuit die.

11. An integrated circuit structure, comprising:
a layer comprising gallium and nitrogen, the layer comprising gallium and nitrogen above a silicon substrate;
a backside structure below the silicon substrate and opposite the layer comprising gallium and nitrogen, the backside structure including conductive features and dielectric structures; and
a waveguide structure including a plurality of through-silicon vias having a co-planar arrangement, individual ones of the through-silicon vias extending through the layer comprising gallium and nitrogen and through the silicon substrate to a corresponding one of the conductive features of the backside structure, and individual ones of the through-silicon vias having a tapered portion coupled to an essentially vertical portion.

12. The integrated circuit structure of claim 11, wherein the essentially vertical portion is in the layer comprising gallium and nitrogen, and the tapered portion is in the silicon substrate.

13. The integrated circuit structure of claim 11, wherein the tapered portion is defined by Si(111) crystal planes.

14. The integrated circuit structure of claim 11, wherein individual ones of the through-silicon vias comprise a dielectric liner and a copper fill.

15. The integrated circuit structure of claim 11, further comprising a layer comprising conductive features above the layer comprising gallium and nitrogen, wherein individual ones of the through-silicon vias extend to a corresponding one of the conductive features of the layer.

16. A computing device, comprising:
a board; and
a component coupled to the board, the component including an integrated circuit structure, comprising:
a layer comprising gallium and nitrogen, the layer comprising gallium and nitrogen above a silicon substrate;

a backside structure below the silicon substrate and
opposite the layer comprising gallium and nitrogen,
the backside structure including conductive features
and dielectric structures; and a waveguide structure including a plurality of through-
silicon vias having a co-planar arrangement, indi-
vidual ones of the through-silicon vias extending
through the layer comprising gallium and nitrogen
and through the silicon substrate to a corresponding
one of the conductive features of the backside struc-
ture, and individual ones of the through-silicon vias
having a tapered portion coupled to an essentially
vertical portion.

17. The computing device of claim 16, further compris-
ing:
a memory coupled to the board.

18. The computing device of claim 16, further compris-
ing:
a power delivery chip coupled to the board.

19. The computing device of claim 16, further compris-
ing:
a camera coupled to the board.

20. The computing device of claim 16, wherein the
component is a packaged integrated circuit die.

* * * * *